(12) United States Patent
Iwasa

(10) Patent No.: US 10,622,500 B2
(45) Date of Patent: Apr. 14, 2020

(54) SOLAR CELL ELEMENT AND SOLAR CELL MODULE

(71) Applicant: KYOCERA CORPORATION, Kyoto (JP)

(72) Inventor: Yuutaro Iwasa, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/044,327

(22) Filed: Jul. 24, 2018

(65) Prior Publication Data

US 2019/0051778 A1    Feb. 14, 2019

(30) Foreign Application Priority Data

Jul. 27, 2017   (JP) .................................. 2017-145318

(51) Int. Cl.
| | |
|---|---|
| *H01L 31/0465* | (2014.01) |
| *H01L 31/18* | (2006.01) |
| *H01L 31/048* | (2014.01) |
| *H01L 31/0216* | (2014.01) |
| *H01L 31/0224* | (2006.01) |
| *H01L 31/068* | (2012.01) |

(52) U.S. Cl.
CPC .... *H01L 31/0465* (2014.12); *H01L 31/02167* (2013.01); *H01L 31/02168* (2013.01); *H01L 31/022425* (2013.01); *H01L 31/048* (2013.01); *H01L 31/068* (2013.01); *H01L 31/1868* (2013.01)

(58) Field of Classification Search
CPC .................. H01L 31/022441; H01L 31/02245
See application file for complete search history.

(56) References Cited

U.S. PATENT DOCUMENTS

| | | | | |
|---|---|---|---|---|
| 4,487,989 A | * | 12/1984 | Wakefield | ......... H01L 31/02243 136/256 |
| 5,034,068 A | * | 7/1991 | Glenn | ............... H01L 31/02243 136/256 |
| 2007/0056625 A1 | * | 3/2007 | Higuchi | ................ H01L 31/048 136/244 |
| 2014/0041720 A1 | * | 2/2014 | Yang | ............... H01L 31/022458 136/256 |
| 2017/0077321 A1 | | 3/2017 | Ito et al. | |

FOREIGN PATENT DOCUMENTS

WO    2015/182503 A1    12/2015

* cited by examiner

*Primary Examiner* — Eli S Mekhlin
(74) *Attorney, Agent, or Firm* — Duane Morris LLP

(57) ABSTRACT

A solar cell element includes a semiconductor substrate, a passivation layer, and a collecting electrode. The semiconductor substrate has a first surface and a second surface that faces in an opposite direction to the first surface. The passivation layer is positioned on the second surface. The collecting electrode is positioned on or above the passivation layer. The passivation layer has a plurality of first holes each penetrating through the passivation layer. The collecting electrode includes a plurality of connection portions and a plurality of second holes. The plurality of connection portions are positioned in connection with the second surface in the plurality of first holes. Each of the plurality of second holes penetrates through the collecting electrode and includes a curved peripheral edge portion in plan view.

12 Claims, 15 Drawing Sheets

F I G. 2
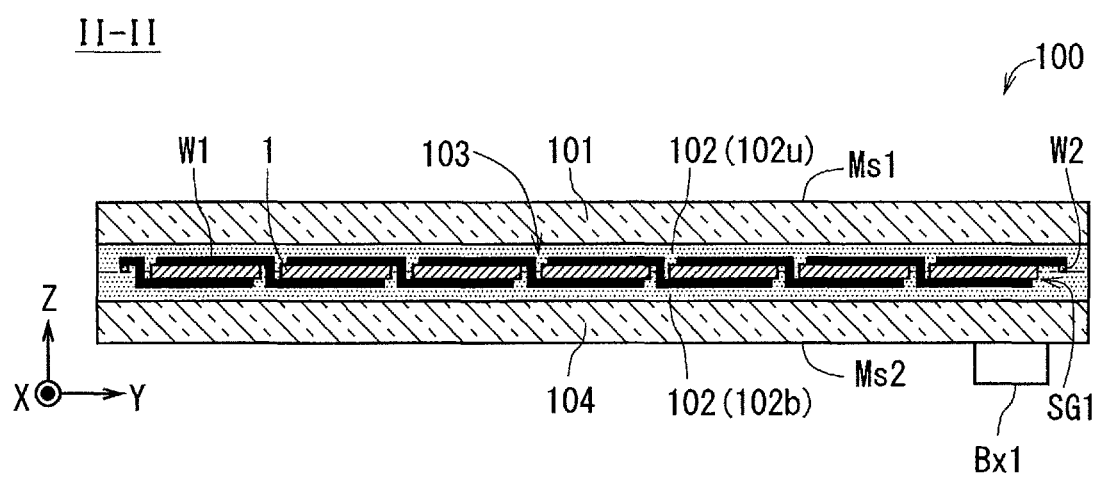

VIa-VIa

VIa-VIa

F I G. 9
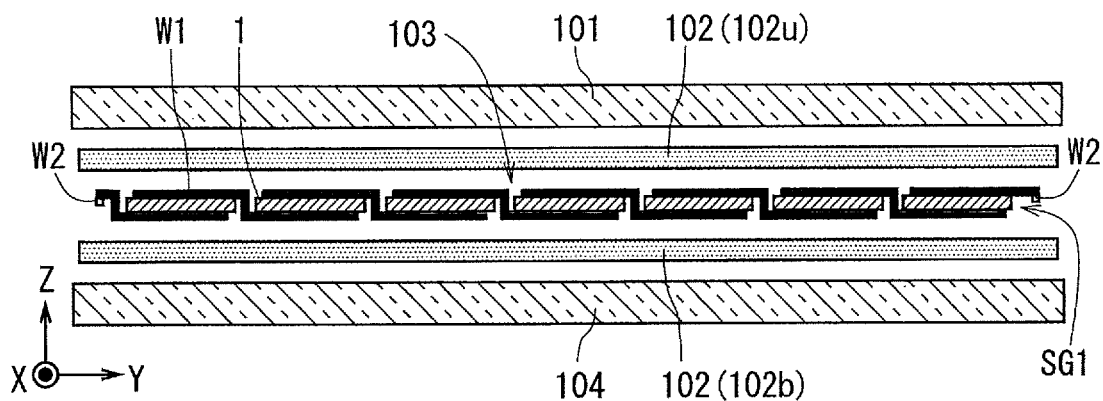

XIIb-XIIb

SOLAR CELL ELEMENT AND SOLAR CELL MODULE

CROSS-REFERENCE TO RELATED APPLICATION

The present application claims priority under 35 U.S.C. § 119 to Japanese Patent Application No. 2017-145318, filed on Jul. 27, 2017, entitled "SOLAR CELL ELEMENT AND SOLAR CELL MODULE". The content of which is incorporated by reference herein in its entirety.

FIELD

Embodiments of the present disclosure relate generally to a solar cell element and a solar cell module.

BACKGROUND

As one type of solar cell elements, there is a passivated emitter and rear cell (PERC) solar cell element.

SUMMARY

A solar cell element and a solar cell module are disclosed.

In one embodiment, a solar cell element includes a semiconductor substrate, a passivation layer, and a collecting electrode. The semiconductor substrate has a first surface and a second surface that faces in an opposite direction to the first surface. The passivation layer is positioned on the second surface. The collecting electrode is positioned on or above the passivation layer. The passivation layer includes a plurality of first holes penetrating through the passivation layer. The collecting electrode includes a plurality of connection portions and a plurality of second holes. The plurality of connection portions are positioned in connection with the second surface in the plurality of first holes. Each of the plurality of second holes penetrates through the collecting electrode and has a curved peripheral edge portion in plan view.

In one embodiment, a solar cell module includes a plurality of solar cell elements of the above one embodiment, a plurality of wires, a first member, a second member, a first filler, and a second filler. The plurality of solar cell elements are two-dimensionally arrayed. The plurality of wires mutually electrically connect adjacent solar cell elements among the plurality of solar cell elements. The first member has light transmissivity, and is positioned on a side of the first surface of the plurality of solar cell elements. The second member is positioned on a side of the second surface of the plurality of solar cell elements. The first filler has light transmissivity, and is positioned between the plurality of solar cell elements and the first member. The second filler is positioned between the plurality of solar cell elements and the second member.

BRIEF DESCRIPTION OF THE DRAWINGS

FIG. 2 illustrates a cross-sectional view showing a cross section of a portion taken across the solar cell module along the line II-II of FIG. 1.

FIG. 9 illustrates a view showing an example of an end surface of a portion taken across the solar cell module along the line II-II of FIG. 1 in the middle of manufacturing of the solar cell module according to the first embodiment.

DETAILED DESCRIPTION

Figure 1:
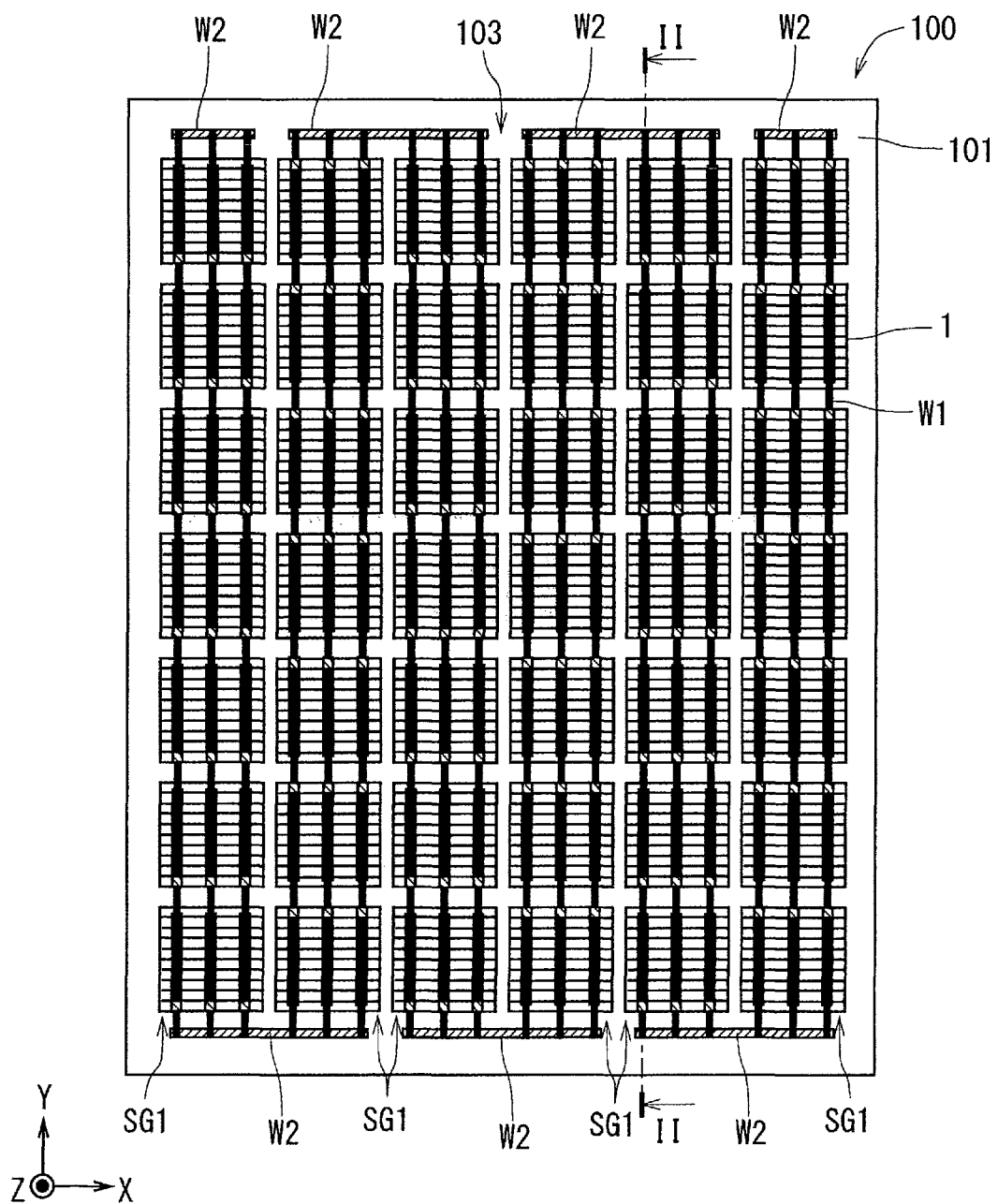
FIG. 1 illustrates a plan view showing external appearance of an example of a solar cell module according to a first embodiment as seen from a first member side.

Each embodiment is described below with reference to the drawings. In the drawings, components having a similar configuration and function are denoted by the same reference symbols, and redundant description will be omitted in the description below. The drawings are schematically illustrated. In FIG. 1 to FIG. 15B, an XYZ coordinate system of the right-handed system is added. In this XYZ coordinate system, a short direction of a first output extracting electrode EL1 extending along a first element surface Es1 of a solar cell element 1 corresponds to a +X direction, a longitudinal direction of the first output extracting electrode EL1 extending along the first element surface Es1 corresponds to a +Y, and a direction orthogonal to both of the +X direction and the +Y direction corresponds to a +Z direction.

1. First Embodiment

1-1. Solar Cell Module

A solar cell module 100 according to a first embodiment is described with reference to FIG. 1 to FIG. 7.

As illustrated in FIG. 1 and FIG. 2, the solar cell module 100 includes, for example, a first member 101, a filler 102, a solar cell portion 103, and a second member 104. The filler 102 includes, for example, a first filler 102u and a second filler 102b. In examples of FIG. 1 and FIG. 2, the first member 101, the first filler 102u, the solar cell portion 103, the second filler 102b, and the second member 104 are laminated in a −Z direction in the mentioned order. The solar cell module 100 has, for example, a front surface (also referred to as a first module surface) Ms1 disposed toward a light source such as mainly the sun, and a back surface (also referred to as a second module surface) Ms2 positioned on the opposite side to the first module surface Ms1.

The solar cell portion 103 includes, for example, a plurality of solar cell elements 1, a plurality of first wires W1, and a plurality of second wires W2. In an example of FIG. 1, the plurality of solar cell elements 1 are two-dimensionally arrayed. Specifically, the solar cell portion 103 includes, for example, a plurality of (here, six) solar cell strings SG1. The solar cell string SG1 includes, for example, a plurality of (here, seven) solar cell elements 1 and a plurality of first wires W1. The plurality of first wires W1 mutually electrically connect, for example, adjacent solar cell elements 1 among the plurality of solar cell elements 1. The plurality of second wires W2 mutually electrically connect adjacent solar cell strings SG1 among the plurality of solar cell strings SG1. Each solar cell element 1 has a first surface (also referred to as a first element surface) Es1 positioned on its front surface side, and a second surface (also referred to as a second element surface) Es2 positioned on the opposite side to the first element surface Es1. In examples of FIG. 1 to FIG. 4, the first element surface Es1 faces in the +Z direction, and the second element surface Es2 faces in the −Z direction.

The first member 101 is, for example, positioned on the first element surface Es1 side of the solar cell portion 103 including a plurality of the solar cell elements 1. The first member 101 can, for example, serve to protect the solar cell portion 103 and also serve to seal the solar cell portion 103. The first member 101 has, for example, transmissivity of light in a particular range of wavelengths. As the particular range of wavelengths, for example, wavelengths of high-intensity light contained in light radiated to the solar cell module 100 and wavelengths of light that can be photoelectrically converted by the solar cell portion 103 are adopted. Adoption of glass or resin such as acryl and polycarbonate as a material of the first member 101, for example, can realize the first member 101 having light transmissivity. Here, as the glass, for example, a material having high light transmittance, such as white sheet glass, tempered glass, or heat-ray reflecting glass having a thickness of from about 2 mm to about 5 mm, is adopted. As the shape of the first member 101, for example, a sheet-like shape, such as a planar sheet-like shape, is adopted. In examples of FIG. 1 and FIG. 2, in plan view of the first member 101 from the +Z side, the outer shape of the first member 101 is a rectangular shape. As a surface of the first member 101 on the +Z direction side, for example, a rectangular (including square; the same shall apply hereinafter) surface having one side of from about 900 mm to about 1,200 mm is adopted.

The second member 104 is, for example, positioned on the second element surface Es2 side of the solar cell portion 103 including a plurality of the solar cell elements 1. Similarly to the first member 101, the second member 104 can, for example, serve to protect the solar cell portion 103 and also serve to seal the solar cell portion 103. Similarly to the first member 101, the second member 104 has, for example, transmissivity of light in a particular range of wavelengths. As a material, shape, and thickness of the second member 104, for example, a material, shape, and thickness similar to those of the first member 101 can be adopted. Further, for the purpose of reducing weight of the solar cell module 100, as the second member 104, a transparent film made of resin, such as polyethylene terephthalate (PET), having a thickness of from about 0.1 mm to about 1 mm can be adopted.

The first filler 102u is, for example, positioned between the plurality of solar cell elements 1 and the first member 101. The second filler 102b is, for example, positioned between the plurality of solar cell elements 1 and the second member 104. In other words, the filler 102 including the first filler 102u and the second filler 102b is, for example, filled between the first member 101 and the second member 104 so as to cover the solar cell portion 103. With this, the first filler 102u and the second filler 102b can, for example, serve to retain the solar cell portion 103 and also serve as a sealant to seal the solar cell portion 103. Similarly to the first member 101 and the second member 104, the first filler 102u and the second filler 102b have light transmissivity. As a material of the first filler 102u and the second filler 102b, for example, thermosetting resin or the like is adopted. As the thermosetting resin, for example, resin containing ethylene-vinyl acetate copolymer (EVA) or polyvinyl butyral (PVB) as its main component is adopted. The thermosetting resin may contain a crosslinking agent. The main component herein signifies a component having the largest (highest) contained ratio (also referred to as a content rate) among contained components.

1-2. Configuration of Solar Cell Element

A schematic configuration of the solar cell element 1 according to the first embodiment is described with reference to FIG. 3A to FIG. 7. The solar cell element 1 according to the first embodiment is a PERC solar cell element.

The solar cell element 1 includes, for example, a semiconductor substrate 10, an antireflection film 11, a passivation layer 12, a protective layer 13, first output extracting electrodes EL1, first collecting electrodes EL2, second output extracting electrodes EL3, and a second collecting electrode EL4.

The semiconductor substrate 10 has a first surface Ss1 and a second surface Ss2 that faces in the opposite direction to the first surface Ss1. The first surface Ss1 is positioned on the first element surface Es1 side of the solar cell element 1. In examples of FIG. 3A to FIG. 4, the first surface Ss1 faces in the +Z direction. The second surface Ss2 is positioned on the second element surface Es2 side of the solar cell element 1. In examples of FIG. 3A to FIG. 4, the second surface Ss2 faces in the −Z direction. The first surface Ss1 and the second surface Ss2 each form a board surface of the semiconductor substrate 10 extending along an XY plane. The semiconductor substrate 10 has a thickness along the +Z direction.

Further, the semiconductor substrate 10 includes, for example, a first semiconductor region 10f and a second semiconductor region 10s. The first semiconductor region 10f is, for example, a region positioned in the semiconductor substrate 10 on the second surface Ss2 side and formed by a semiconductor having a first conductivity type. The second semiconductor region 10s is, for example, a region positioned in the semiconductor substrate 10 on the first surface Ss1 side and formed by a semiconductor having a second conductivity type opposite to the first conductivity type. In an example of FIG. 4, the second semiconductor region 10s is positioned in a surface layer portion in the semiconductor substrate 10 on the first surface Ss1 side. In other words, the second semiconductor region 10s is positioned on the first semiconductor region 10f.

Here, for example, a case where the semiconductor substrate 10 is a silicon substrate is considered. In this case, as the silicon substrate, a polycrystalline or monocrystalline silicon substrate is adopted. The silicon substrate is, for example, a thin substrate having a thickness of 250 μm or less, or of 150 μm or less. Further, the silicon substrate has, for example, in plan view, a substantially rectangular board surface having one side of from about 150 mm to about 200 mm. Adoption of the semiconductor substrate 10 having such a shape can reduce intervals between the solar cell elements 1 at the time of manufacturing of the solar cell module 100 with the array of the plurality of solar cell elements 1.

Further, for example, in a case where the first conductivity type is a p type and the second conductivity type is an n type, a p-type silicon substrate can be manufactured by, for example, doping polycrystalline or monocrystalline silicon crystals with impurities such as boron or gallium as a dopant element. In this case, impurities, such as phosphorus, as a dopant are diffused in a surface layer portion on the first surface Ss1 side of the p-type silicon substrate, whereby an n-type second semiconductor region 10s can be generated. At this time, the semiconductor substrate 10 in which a p-type first semiconductor region 10f and the n-type second semiconductor region 10s are laminated can be formed. With this, the semiconductor substrate 10 includes a pn junction portion positioned at an interface between the first semiconductor region 10f and the second semiconductor region 10s.

Figure 4:
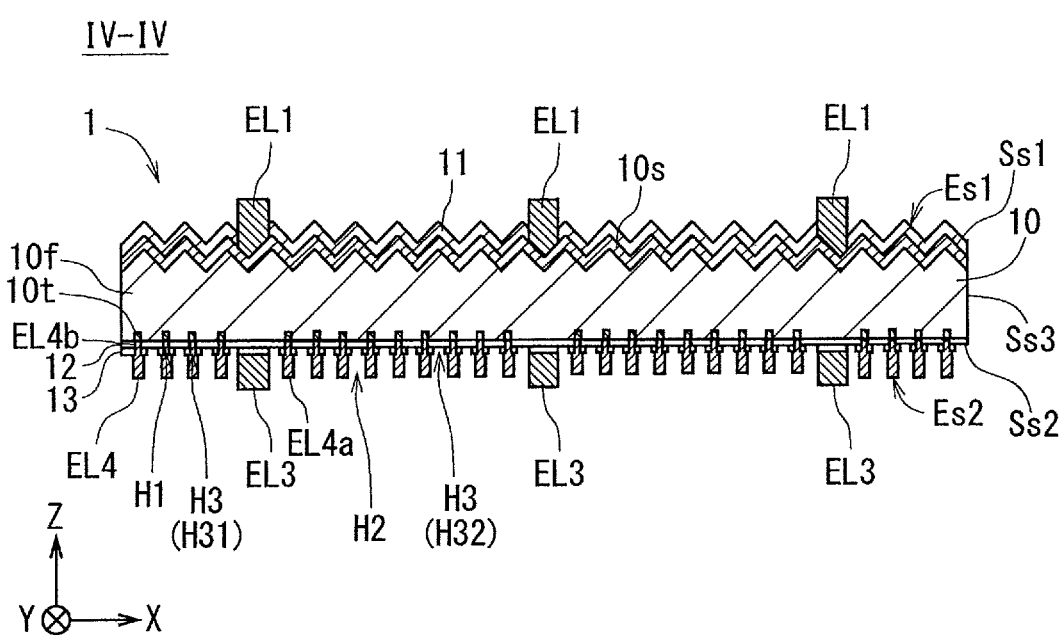
FIG. 4 illustrates a view showing an end surface of a portion taken across the solar cell element along the line IV-IV of FIG. 3A and FIG. 3B.
Figure 5A:
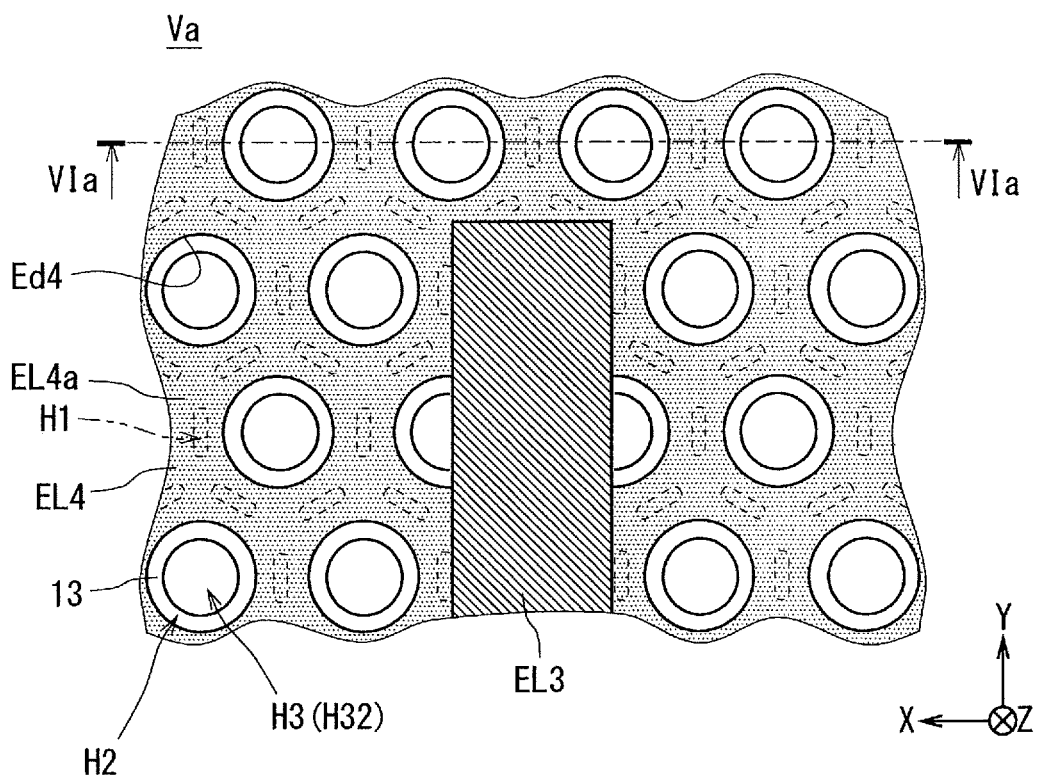
FIG. 5A illustrates an enlarged plan view showing enlarged external appearance of the portion Va of FIG. 3B as seen from the second element surface side.
Figure 5B:
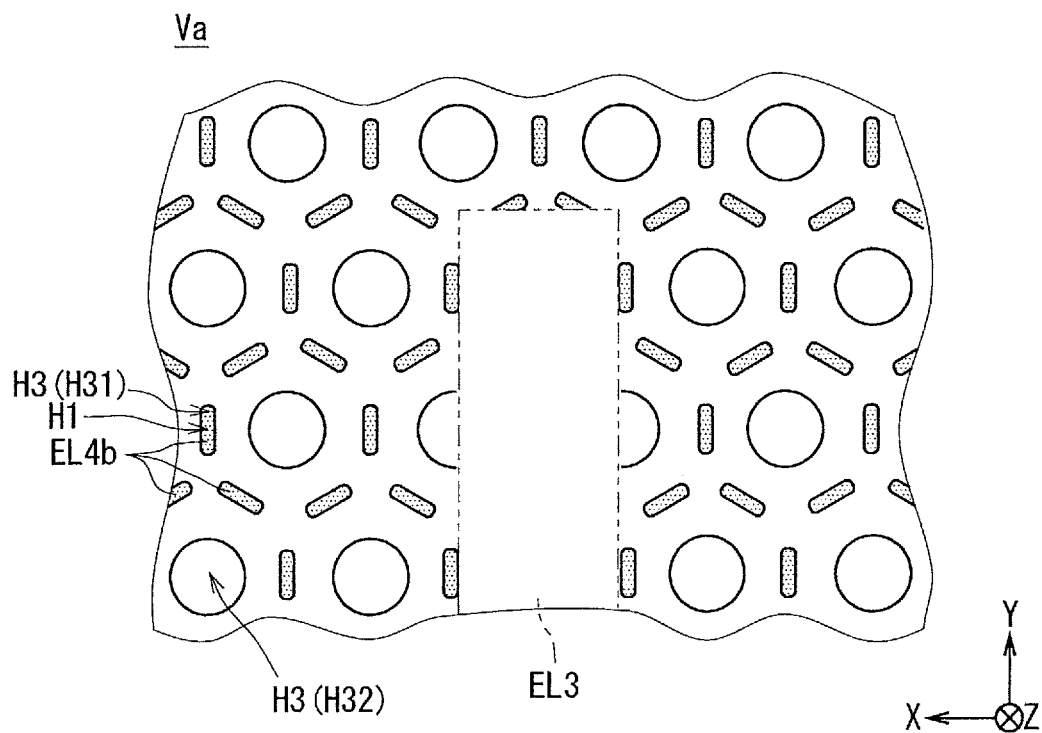
FIG. 5B illustrates an enlarged plan view showing an enlarged configuration of a protective layer at the portion Va of FIG. 3B.

As illustrated in FIG. 4, the first surface Ss1 of the semiconductor substrate 10 may have, for example, a fine rough structure (texture) for reducing reflectance of radiated light. The height of a protruding portion of the texture is, for example, from about 0.1 μm to about 10 μm. The distance between apexes of adjacent protruding portions is, for example, from about 0.1 μm to about 20 μm. In the texture, for example, a recessed portion may be a substantially spherical surface, and the protruding portion may have a pyramid shape. The above-mentioned "height of a protruding portion" corresponds to, for example, in FIG. 4, assuming a straight line passing along the bottom surface of the recessed portions as a reference line, a distance from the reference line to the apex of the protruding portion in a direction perpendicular to the reference line (here, the +Z direction). Further, the fine rough structure may be present in the second surface Ss2 as well.

Further, the semiconductor substrate 10 includes a third semiconductor region 10t. The third semiconductor region 10t is positioned in a surface layer portion in the semiconductor substrate 10 on the second surface Ss2 side. It is only necessary that a conductivity type of the third semiconductor region 10t be identical with the conductivity type of the first semiconductor region 10f (p type in the first embodiment). The concentration of a dopant contained in the third semiconductor region 10t is higher than the concentration of a dopant contained in the first semiconductor region 10f. The third semiconductor region 10t forms an internal electric field on the second surface Ss2 side of the semiconductor substrate 10. With this, in the vicinity of the second surface Ss2 of the semiconductor substrate 10, recombination of minority carriers that are generated due to photoelectric conversion in response to radiation of light on the semiconductor substrate 10 can be reduced. As a result, photoelectric conversion efficiency is hardly reduced. The third semiconductor region 10t can be formed, for example, by diffusing a dopant element, such as aluminium, in a surface layer portion in the semiconductor substrate 10 on the second surface Ss2 side. At this time, for example, the concentration of a dopant element contained in the first semiconductor region 10f can be from about $5 \times 10^{15}$ atoms/cm$^3$ to about $1 \times 10^{17}$ atoms/cm$^3$, and the concentration of a dopant element contained in the third semiconductor region 10t can be from about $1 \times 10^{18}$ atoms/cm$^3$ to about $5 \times 10^{21}$ atoms/cm$^3$. It is only necessary that the third semiconductor region 10t be, for example, present at a portion in the semiconductor substrate 10 that is brought into contact with the second collecting electrode EL4 (described later) on the back surface side.

The antireflection film 11 is, for example, positioned on the first surface Ss1 side of the semiconductor substrate 10. The antireflection film 11 can, for example, reduce reflectance of light radiated to the first element surface Es1 of the solar cell element 1. As a material of the antireflection film 11, for example, silicon oxide, aluminium oxide, silicon nitride, or the like can be adopted. The refractive index and the thickness of the antireflection film 11 are, for example, appropriately set to such a value that light of the sunlight within a range of wavelengths that can be absorbed into the semiconductor substrate 10 and contribute to the generation of electric power can meet conditions for low reflectance (also referred to as low reflection conditions). Here, for example, the refractive index of the antireflection film 11 is from about 1.8 to about 2.5, and the thickness of the antireflection film 11 is from about 50 nm to about 120 nm. The antireflection film 11 can be formed, for example, using a plasma-enhanced chemical vapor deposition (PECVD) method or a sputtering method.

The passivation layer 12 is positioned at least on the second surface Ss2 of the semiconductor substrate 10. In the first embodiment, the passivation layer 12 is in contact with the second surface Ss2 of the semiconductor substrate 10. The passivation layer 12 can, for example, reduce recombination of minority carriers that are generated due to photoelectric conversion in response to radiation of light on the semiconductor substrate 10. As a material of the passivation layer 12, for example, aluminium oxide or the like is adopted. In this case, the passivation layer 12 can be formed, for example, using an atomic layer deposition (ALD) method. Here, the aluminium oxide has a negative fixed charge. Therefore, owing to the electric field effect, minority carriers (in this case, electrons) generated on the second surface Ss2 side of the semiconductor substrate 10 are brought away from the second surface Ss2 serving as an interface between the p-type first semiconductor region 10f and the passivation layer 12. With this, recombination of minority carriers in the vicinity of the second surface Ss2 of the semiconductor substrate 10 can be reduced. Therefore, photoelectric conversion efficiency of the PERC solar cell element 1 can be enhanced. The thickness of the passivation layer 12 is, for example, from about 10 nm to about 60 nm. The passivation layer 12 may be positioned, for example, also on the first surface Ss1 of the semiconductor substrate 10. Further, the passivation layer 12 may be positioned, for example, also on an end surface Ss3 connecting the first surface Ss1 and the second surface Ss2 of the semiconductor substrate 10.

Further, the passivation layer 12 is not limited to a single layer. The passivation layer 12 may have, for example, a structure in which a plurality of layers are laminated. Examples of combination of the plurality of layers include a combination of a silicon oxide layer having a thickness of from about 3 nm to about 10 nm that is positioned on the second surface Ss2 of the semiconductor substrate 10 and an aluminium oxide layer having a thickness of from about 10 nm to about 60 nm that is positioned on the silicon oxide. In this case, for example, the passivation layer 12 may be formed by depositing a silicon oxide film on the second surface Ss2 of the semiconductor substrate 10 and then depositing an aluminium oxide film on the silicon oxide film. Such deposition of silicon oxide on the p-type first semiconductor region 10f can terminate dangling bonds of the first semiconductor region 10f. With this, photoelectric conversion efficiency of the solar cell element 1 can further be enhanced. The silicon oxide film and the aluminium oxide film can be deposited consecutively using the ALD method.

Here, the passivation layer 12 has, for example, a plurality of holes (also referred to as first holes) H1. Each of the first holes H1 penetrates through the passivation layer 12 in a thickness direction of the passivation layer 12 (here, the +Z direction).

The protective layer 13 is, for example, positioned on the second surface Ss2 side of the semiconductor substrate 10. In the first embodiment, the protective layer 13 is, for example, positioned on the passivation layer 12 that is positioned on the second surface Ss2 of the semiconductor substrate 10. Further, the protective layer 13 covers the passivation layer 12 from above the passivation layer 12. With this, the protective layer 13 can, for example, protect the passivation layer 12. As a material of the protective layer 13, for example, silicon oxide, silicon nitride, insulating resin, or the like is adopted. The protective layer 13 has a desired pattern on the passivation layer 12. The protective layer 13 has a plurality of holes H3 penetrating through the protective layer 13 in a thickness direction thereof (here, the +Z direction). The hole H3 may be, for example, a hole that forms a through hole whose circumference along the second surface Ss2 is closed, or may be a slit-like hole whose circumference along the second surface Ss2 is at least partially opened. The holes H3 include, for example, holes H31 in communication with the first holes H1 of the passivation layer 12, and holes H32 out of communication with the first holes H1 of the passivation layer 12.

The protective layer 13 is, for example, formed on the passivation layer 12 that is formed on the second surface Ss2 of the semiconductor substrate 10 with a wet process or a dry process. As the wet process, for example, a method of applying, drying, and heating an insulation paste, or the like is applicable. As the dry process, for example, a method using the PECVD method, the sputtering method, or the like is applicable.

Here, for example, in a case where the protective layer 13 is a thin film made of silicon nitride or the like, the protective layer 13 can be formed using the PECVD method, the sputtering method, or the like. At this time, for example, the holes H3 having a desired pattern may be formed on the second surface Ss2 side of the semiconductor substrate 10 with laser beam radiation using a laser device. As the laser device, for example, a Q-switching neodymium-doped yttrium aluminum garnet (Nd:YAG) laser or the like is applicable. At this time, for example, the holes H3 having a desired pattern may be formed on the second surface Ss2 side of the semiconductor substrate 10 using a mask. Further, for example, in a case where the protective layer 13 is a thin film containing siloxane resin or the like, the protective layer 13 can be formed in such a manner that an insulation paste is applied on the passivation layer 12 with a coating method such as screen printing so as to have a desired pattern and the insulation paste is then dried. As the insulation paste, for example, an insulation paste containing siloxane resin as a material of the protective layer 13, an organic solvent, and a plurality of fillers is applicable. The siloxane resin is a siloxane compound having a Si—O—Si bond (also referred to as a siloxane bond). Specifically, as the siloxane resin, for example, low molecular weight resin having molecular weight of 15,000 or less that is generated through hydrolysis and condensation polymerization of alkoxysilane, silazane, or the like is adopted.

The protective layer 13 may be, for example, formed on the end surface Ss3 of the semiconductor substrate 10. In this case, for example, leakage current is hardly generated in the solar cell element 1 owing to the presence of the protective layer 13.

The first output extracting electrode EL1 and the first collecting electrode EL2 are positioned on the first surface Ss1 side of the semiconductor substrate 10.

The first output extracting electrode EL1 is an electrode (also referred to as a bus bar electrode) that can collect carriers generated due to photoelectric conversion in response to radiation of light on the semiconductor substrate 10 via the first collecting electrode EL2 and can extract electricity to the outside of the solar cell element 1. Approximately from two to six first output extracting electrodes EL1 are present substantially in parallel with each other, for example. In examples of FIG. 3A and FIG. 4, three first output extracting electrodes EL1 are present on the first surface Ss1 side of the semiconductor substrate 10. Each first output extracting electrode EL1 has a longitudinal direction along the first surface Ss1. The longitudinal direction corresponds to the +Y direction. Further, each first output extracting electrode EL1 has a short direction (also referred to as a widthwise direction) intersecting the longitudinal direction. The widthwise direction corresponds to the +X direction. Here, the first output extracting electrode EL1 has, for example, in plan view, an elongated rectangular shape. The length (also referred to as width) in the short direction of the first output extracting electrode EL1 is, for example, from about 0.8 mm to about 2 mm. At least a part of the first output extracting electrode EL1 intersects with the first collecting electrode EL2 to be electrically connected therewith.

The first collecting electrode EL2 is an electrode that can collect carriers generated due to photoelectric conversion in response to radiation of light on the semiconductor substrate 10. In an example of FIG. 3A, a plurality of first collecting electrodes EL2 are present on the first surface Ss1 side of the semiconductor substrate 10. Each first collecting electrode EL2 has a longitudinal direction along the first surface Ss1. The longitudinal direction corresponds to the +X direction. Further, each first collecting electrode EL2 has a short direction (also referred to as a widthwise direction) intersecting the longitudinal direction. Here, each first collecting electrode EL2 is, for example, a linear electrode having a width of from about 30 m to about 150 µm. That is, the width of the first collecting electrode EL2 is smaller than the width of the first output extracting electrode EL1. The plurality of first collecting electrodes EL2 are, for example, arrayed with intervals of from about 1 mm to about 3 mm.

The thickness of the first output extracting electrode EL1 and the first collecting electrode EL2 is, for example, from about 10 µm to about 40 µm. The first output extracting electrode EL1 and the first collecting electrode EL2 can be, for example, formed in such a manner that a metallic paste (also referred to as a silver paste) that contains metal powder including silver as a main component, an organic vehicle, and a glass frit is applied in a desired shape with screen printing or the like and the silver paste is then fired. Further, for example, on the first surface Ss1, an auxiliary electrode having a similar shape as that of the first collecting electrode EL2 may be positioned along a peripheral edge portion of the semiconductor substrate 10 so as to electrically connect the first collecting electrodes EL2.

The second output extracting electrode EL3 and the second collecting electrode EL4 are positioned on the second surface Ss2 side of the semiconductor substrate 10. The second output extracting electrode EL3 and the second collecting electrode EL4 are electrically connected with each other.

The second output extracting electrode EL3 is an electrode that can collect carriers generated due to photoelectric conversion in response to radiation of light on the semiconductor substrate 10 via the second collecting electrode EL4 and can extract electricity to the outside of the solar cell element 1. Here, for example, in a case where the solar cell module is manufactured by electrically connecting a plurality of solar cell elements 1 in series, the second output extracting electrode EL3 on the second surface Ss2 side and the first output extracting electrode EL1 on the first surface Ss1 side are connected with the first wire W1 between adjacent solar cell elements 1. Here, the first wire W1 is, for example, joined to the second output extracting electrode EL3 and the first output extracting electrode EL1 with solder or the like.

Approximately from two to six second output extracting electrodes EL3 are present substantially in parallel with each other at positions roughly opposed to the first output extracting electrodes EL1 across the semiconductor substrate 10. In examples of FIG. 3A and FIG. 3B, three second output extracting electrodes EL3 are present on the second surface Ss2 side of the semiconductor substrate 10. Each second output extracting electrode EL3 has a longitudinal direction along the second surface Ss2. The longitudinal direction corresponds to the +Y direction. Further, each second output extracting electrode EL3 is made up of an N number of (N being an integer of 2 or more) island-like electrode portions (also referred to as island electrode portions) that are arrayed along the +Y direction being the longitudinal direction. Here, for example, the number N is four. That is, the island electrode portions in three rows that are each arrayed along the longitudinal direction (here, the +Y direction) of the second output extracting electrode EL3 are present on the second surface Ss2 side of the semiconductor substrate 10. Further, the second output extracting electrode EL3 has a widthwise direction intersecting the longitudinal direction. The widthwise direction corresponds to the +X direction.

The thickness of the second output extracting electrode EL3 is, for example, from about 5 µm to about 20 µm. The width of the second output extracting electrode EL3 is, for example, from about 0.8 mm to about 3 mm. In a case where the second output extracting electrode EL3 contains silver as its main component, the second output extracting electrode EL3 can be, for example, formed in such a manner that a silver paste is applied in a desired shape with screen printing or the like and the silver paste is then fired. At the time when the silver paste is fired, for example, the silver paste applied directly on the passivation layer 12 in the holes H3 of the protective layer 13 may fire through the passivation layer 12. In this case, for example, at least a part of the second output extracting electrode EL3 is directly connected to the second surface Ss2 of the semiconductor substrate 10.

Figure 3A:
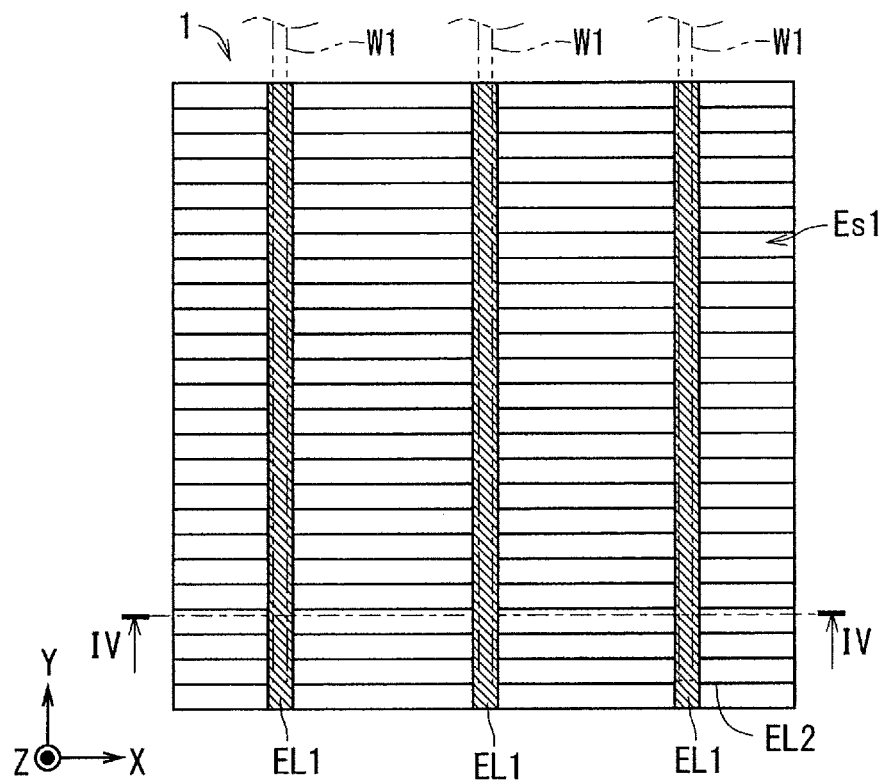
FIG. 3A illustrates a plan view showing external appearance of an example of a solar cell element according to the first embodiment as seen from a first element surface side.
Figure 3B:
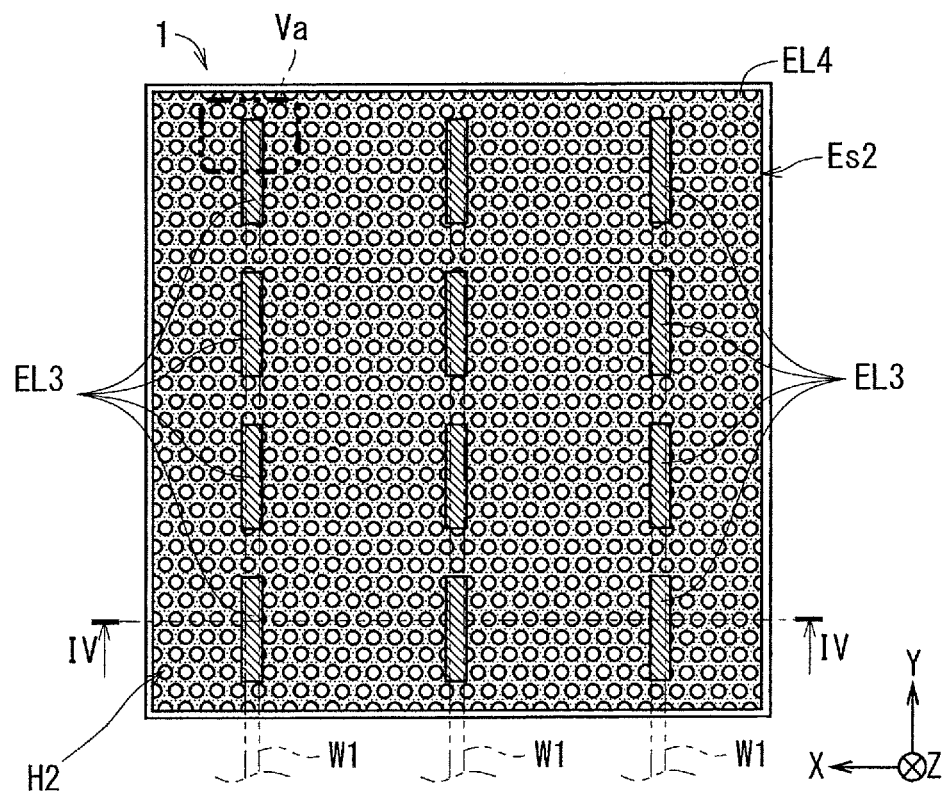
FIG. 3B illustrates a plan view showing external appearance of the example of a solar cell element according to the first embodiment as seen from a second element surface side.

The second collecting electrode EL4 is positioned on or above the passivation layer 12. The second collecting electrode EL4 can, for example, on the second surface Ss2 side of the semiconductor substrate 10, collect carriers generated due to photoelectric conversion in response to radiation of light on the semiconductor substrate 10. As illustrated in FIG. 3B and FIG. 4, the second collecting electrode EL4 has, for example, a plurality of holes (also referred to as second holes) H2. Each of the second holes H2 penetrates through the second collecting electrode EL4 in a thickness direction of the second collecting electrode EL4 (here, the +Z direction). In an example of FIG. 3B, in plan view of the second element surface Es2, the second collecting electrode EL4 is present across substantially the entire surface of the second element surface Es2. Further, the plurality of second holes H2 are present across substantially the entire surface of the second element surface Es2. In the first embodiment, for example, in plan view of the second element surface Es2, the passivation layer 12 has an optically exposed portion inside each of the second holes H2. Here, the "optically exposed" state signifies a state that can be subjected to irradiation of visible light from the outside. Therefore, the optically exposed portion in each of the second holes H2 of the passivation layer 12 is visually recognizable by a human in plan view of the second element surface Es2. Therefore, owing to the presence of the plurality of second holes H2, in the solar cell element 1, the light radiated to the second element surface Es2 can pass through the plurality of second holes H2 and can enter the semiconductor substrate 10. The light radiated to the second element surface Es2 can be, for example, generated by reflection of sunlight from the ground etc. With this, for example, in the semiconductor substrate 10, not only photoelectric conversion in response to light received on the first surface Ss1, but also photoelectric conversion in response to light passing through the second holes H2 and received on the second surface Ss2 can be carried out, without reduction of the effects of the passivation layer 12. As a result, for example, photoelectric conversion efficiency of the PERC solar cell element 1 can be enhanced.

In the first embodiment, for example, each second hole H2 is in communication with, among the holes H3 of the protective layer 13, the hole (also referred to as a fourth hole) H32 different from the hole (also referred to as a third hole) H31. In other words, for example, in plan view of the second element surface Es2, the fourth hole H32 of the protective layer 13 is positioned in a region inside of each second hole H2. With this, for example, light that passes through the second holes H2 of the second collecting electrode EL4 to be radiated to the second surface Ss2 is hardly blocked by the protective layer 13. As a result, for example, photoelectric conversion efficiency of the PERC solar cell element 1 can be enhanced.

Further, in the first embodiment, the second collecting electrode EL4 is, for example, positioned above the passivation layer 12, and the protective layer 13 is sandwiched between the second collecting electrode EL4 and the passivation layer 12. The second collecting electrode EA includes a first portion EL4a and a plurality of second portions EL4b. The first portion EL4a and the plurality of second portions EL4b are connected to each other. The first portion EL4a is, for example, positioned on the protective layer 13. Each of the second portions (also referred to as connection portions) EL4b is, for example, in connection with the second surface Ss2 inside the third hole H31 of the protective layer 13 and the first hole H1 of the passivation layer 12. In other words, each second portion EL4b is at least positioned from the inside of the third hole H31 to the inside of the first hole H1.

The thickness of the second collecting electrode EL4 is, for example, from about 15 µm to about 50 µm. Here, for example, in a case where the second collecting electrode EL4 contains aluminium as its main component, the second collecting electrode EL4 can be formed in such a manner that, for example, an aluminium paste is applied in a desired shape with screen printing or the like and the aluminium paste is then fired. As the aluminium paste, for example, a metallic paste that contains metal powder including aluminium as a main component, an organic vehicle, and a glass frit is adopted. At the time when the aluminium paste is fired, for example, the aluminium paste applied directly on the passivation layer 12 in the third holes H31 of the protective layer 13 can fire through the passivation layer 12. At this time, the first holes H1 of the passivation layer 12 can be formed. With this, for example, at least a part of the second collecting electrode EL4 is directly connected to the second surface Ss2 of the semiconductor substrate 10. Further, at the time when the aluminium paste is fired, for example, aluminium in the aluminium paste is diffused in the surface layer portion of the second surface Ss2 of the semiconductor substrate 10, thereby forming the third semiconductor region 10t.

Further, here, for example, in a portion of the passivation layer 12 that is covered by the protective layer 13, the aluminium paste does not fire through the passivation layer 12. With this, in the solar cell element 1, the passivation layer 12 can remain on the second surface Ss2 of the semiconductor substrate 10, having a pattern corresponding to the desired pattern of the protective layer 13. Here, for example, in a case where the protective layer 13 is formed of silicon nitride with the PECVD method, the thickness of the protective layer 13 is, for example, from about 70 nm to about 200 nm. Further, in a case where the protective layer 13 is formed using an insulation paste, the thickness of the protective layer 13 is, for example, from about 0.5 µm to about 10 µm. The thickness of the protective layer 13 in this case is, for example, appropriately changed in accordance with composition of the insulation paste for forming the protective layer 13, the shape of the second surface Ss2 of the semiconductor substrate 10, firing conditions at the time of forming the second collecting electrode EL4, etc.

1-3. Configuration of Solar Cell Element on Second Surface Side

As illustrated in FIG. 5A to FIG. 6A, for example, in plan view of the second element surface Es2, the shape of a portion in a peripheral edge (also referred to as a peripheral edge portion) Ed4 of each second hole H2 in the second collecting electrode EL4 is a curved shape. Here, examples of the shape of the curved peripheral edge portion Ed4 in plan view of the second element surface Es2 include an oval shape, a circular shape, etc. Such curved configuration of the peripheral edge portion Ed4 of the second hole H2 of the second collecting electrode EL4 in plan view of the second element surface Es2, for example, hardly generates a portion where angles are discontinuously changed in an inner peripheral surface of the second hole H2. With this, for example, even if the solar cell element 1 is bent in response to applied stress or the like, the stress is hardly concentrated in the second hole H2 of the second collecting electrode EL4. Therefore, for example, the solar cell element 1 is hardly cracked. Therefore, for example, reliability of the PERC solar cell element 1 can be enhanced.

Here, as illustrated in FIG. 5A to FIG. 6A, for example, in a perspective plan view seen through the second element surface Es2, the plurality of connection portions EL4b may include at least two connection portions EL4b that are arrayed so as to surround the second hole H2 for each second hole H2. In examples of FIG. 5A and FIG. 5B, in a perspective plan view seen through the second element surface Es2, each second hole H2 is surrounded by six connection portions EL4b. Here, each connection portion EL4b has, for example, an elongated shape having its longitudinal direction along a circumferential direction of the second hole H2. Adoption of such a configuration can, for example, reduce the movement distance of the carriers generated due to photoelectric conversion in the semiconductor substrate 10 in response to light passing through the second holes H2 until reaching the second collecting electrode EL4. With this, for example, a series resistance component in the solar cell element 1 can be reduced. Further, here, for example, adoption of a configuration in which at least two connection portions EL4b are discontinuously present so as to surround one second hole H2 hardly reduces the area of the passivation layer 12. With this, for example, the passivation effect owing to the presence of the passivation layer 12 can be sufficiently attained. As a result, for example, photoelectric conversion efficiency of the PERC solar cell element 1 can be enhanced.

Figure 6A:
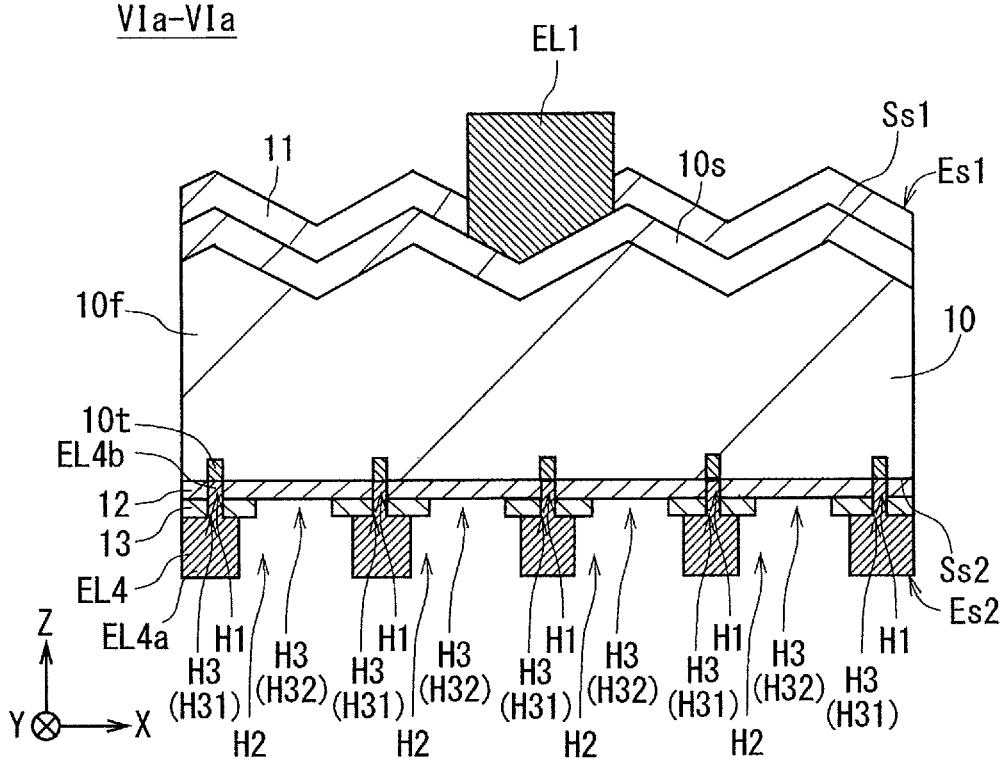
FIG. 6A illustrates a view showing an example of an end surface of a portion taken across the solar cell element along the line VIa-VIa of FIG. 5A.
Figure 6B:
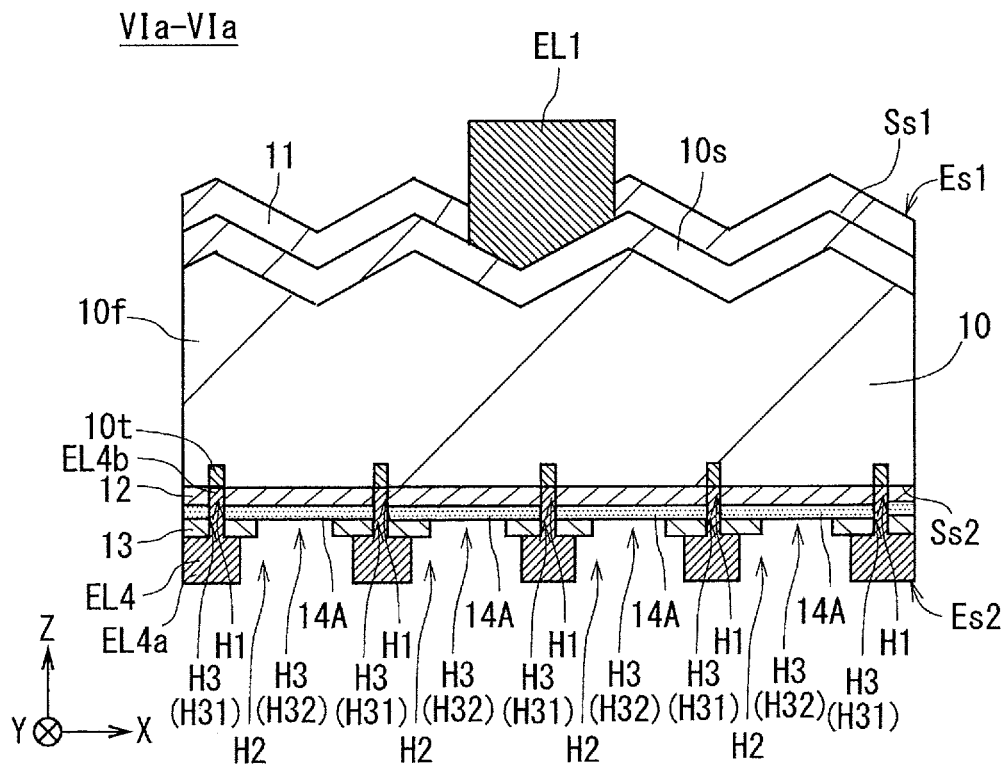
FIG. 6B illustrates a view showing another example of the end surface of the portion taken across the solar cell element along the line VIa-VIa of FIG. 5A.

Here, for example, as illustrated in FIG. 6B, an antireflection film 14A made of a material different from that of the passivation layer 12 may be present on the passivation layer 12 on the opposite side to the semiconductor substrate 10. In this case, for example, in plan view of the second element surface Es2, the antireflection film 14A may be positioned in a region inside of each second hole H2. In this case, the refractive index and the thickness of the antireflection film 14A are, for example, appropriately set to such a value that light of the sunlight within a range of wavelengths that can be absorbed into the semiconductor substrate 10 and contribute to the generation of electric power can meet conditions for low reflectance (also referred to as low reflection conditions). With this, for example, reflection of light to enter the second holes H2 can be reduced. Therefore, for example, in the solar cell element 1, the amount of light to enter the second surface Ss2 can be increased. As a result, for example, photoelectric conversion efficiency of the PERC solar cell element 1 can be enhanced.

Further, here, when the material of the antireflection film 14A contains a material of at least one of silicon nitride and silicon oxide, for example, the antireflection film 14A attains high resistance to heating, humidity, etc. and can thus be stably present. Therefore, for example, the antireflection film 14A can serve to reduce reflection of light on the second surface Ss2 side of the solar cell element 1 and also serve as a layer to protect the passivation layer 12. Similarly to the antireflection film 11, the antireflection film 14A can be formed, for example, using the PECVD method or the sputtering method. Here, for example, when the material of the antireflection film 14A and the material of the antireflection film 11 are the same, the antireflection film 14A may be formed simultaneously with the antireflection film 11.

Figure 7:
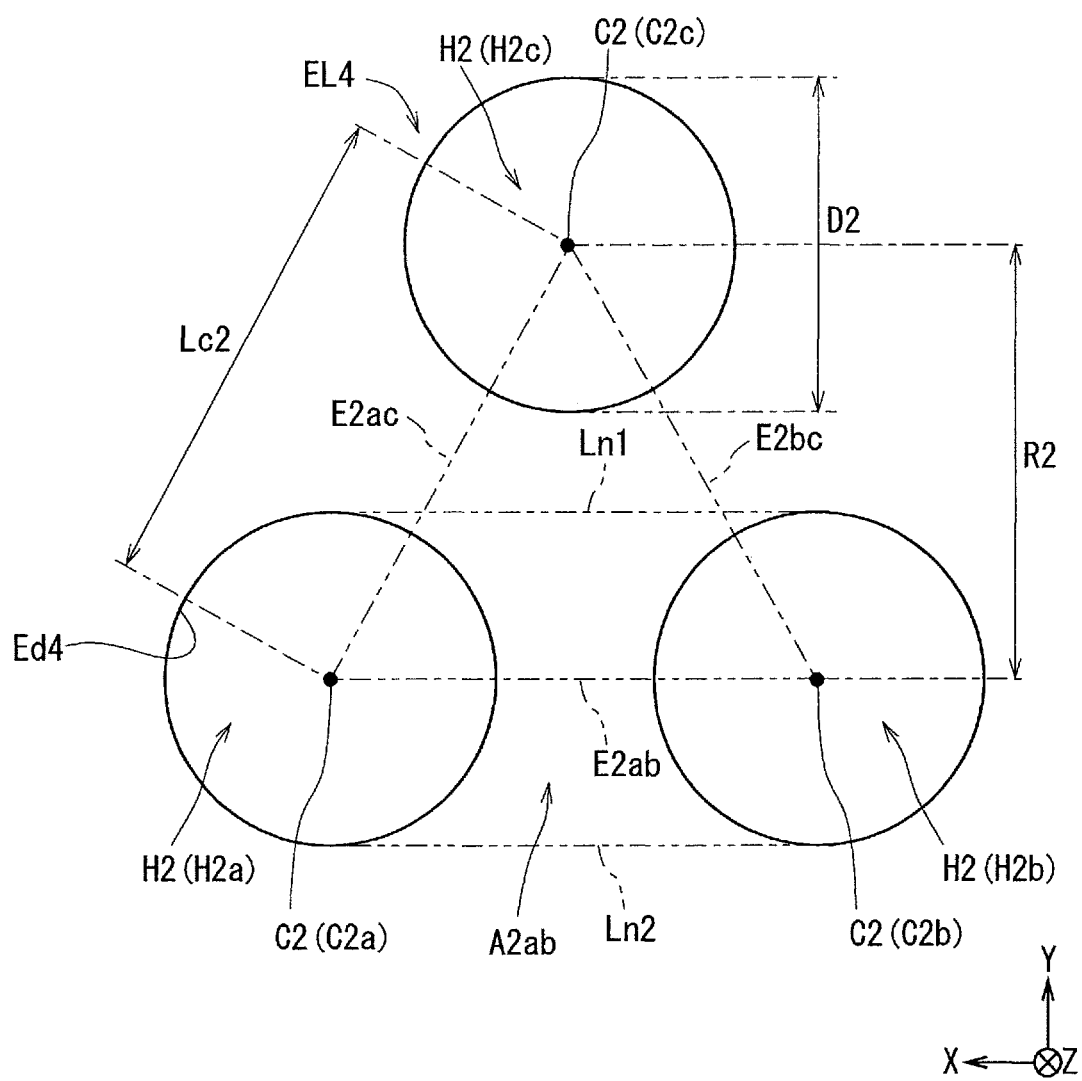
FIG. 7 illustrates a view showing an example of an arrayed state of a plurality of second holes in a collecting electrode.

Incidentally, as illustrated in FIG. 7, a second-A hole H2a, a second-B hole H2b, and a second-C hole H2c that are included in the plurality of second holes H2 and are positioned adjacently to each other are focused. Here, in plan view of the second element surface Es2, a line (also referred to as an imaginary line) E2ab indicated by a two-dot chain line that virtually connects the center (also referred to as a first center) C2a of the second-A hole H2a and the center (also referred to as a second center) C2b of the second-B hole H2b is considered. In an example of FIG. 7, the imaginary line E2ab extends along the +X direction. In this case, for example, in a direction (also referred to as an orthogonal direction) being orthogonal to the imaginary line E2ab, the second-C hole H2c may be positioned away from a region A2ab positioned between the second-A hole H2a and the second-B hole H2b. The region A2ab is a region surrounded by the second-A hole H2a, the second-B hole H2b, an imaginary line Ln1 indicated by a two-dot chain line, and an imaginary line Ln2 indicated by a two-dot chain line. The imaginary line Ln1 is a line virtually connecting an edge portion of the second-A hole H2a on the +Y direction side and an edge portion of the second-B hole H2b on the +Y direction side. The imaginary line Ln2 is a line virtually connecting an edge portion of the second-A hole H2a on the −Y direction side and an edge portion of the second-B hole H2b on the −Y direction side. Adoption of such a configuration enables, for example, in plan view of the second element surface Es2, carriers to linearly move in a region between adjacent second holes H2 of the second collecting electrode EL4 toward the second output extracting electrodes EL3. In an example of FIG. 7, carriers can linearly move in a region between the second-C hole H2c of the second collecting electrode EL4 and the imaginary line Ln1 toward the second output extracting electrodes EL3. With this, for example, a series resistance component in the solar cell element 1 can be reduced.

Specifically, for example, in plan view of the second element surface Es2, a case where the outer shape of each second hole H2 is circular and three imaginary lines virtually connecting the centers C2 of three adjacent second holes H2 form an equilateral triangle is conceivable. Here, for example, an imaginary line E2bc indicated by a two-dot chain line that virtually connects the second center C2b and the center (also referred to as a third center) C2c of the second-C hole H2c, and an imaginary line E2ac indicated by a two-dot chain line that virtually connects the first center C2a and the third center C2c are considered. Then, a case where the three imaginary lines E2ab, E2bc, and E2ac form an equilateral triangle is conceivable. With this, for example, in the second collecting electrode EL4, the density of the plurality of second holes H2 each having a circular outer edge shape can be increased while intervals between the second holes H2 are secured in a certain degree. Further, for example, when a length Lc2 between the centers C2 of two adjacent second holes H2 forming the equilateral triangle is larger than a diameter D2 of the second hole H2, a part of the second collecting electrode EL4 can be present between adjacent second holes H2 each having a circular outer edge shape. In this case, when the formula (1) is satisfied, a length R2 between the imaginary line E2ab and the third center C2c is larger than the diameter D2. With this, a part of the second collecting electrode EL4 can be present in a region between the second-C hole H2c and the imaginary line Ln1.

$$(\text{Length } Lc2) > (\text{Diameter } D2) \times (2/\sqrt{3}) \quad (1)$$

1-4. Method of Manufacturing Solar Cell Element

An example of a method of manufacturing the solar cell element 1 is described with reference to FIG. 8A to FIG. 8F and FIG. 4.

Figure 8A:
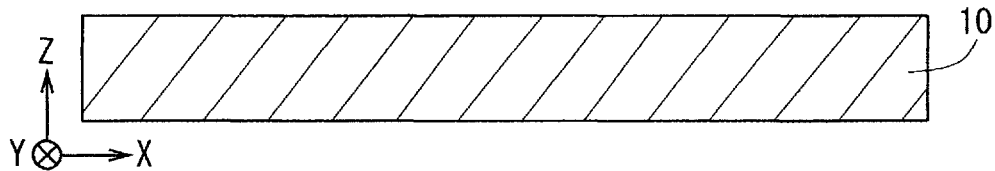
FIG. 8A to FIG. 8F each illustrate a view showing an example of a portion corresponding to the portion taken across the solar cell element along the line IV-IV of FIG. 3A and FIG. 3B in the middle of manufacturing of the solar cell element according to the first embodiment.

Here, firstly, as illustrated in FIG. 8A, the semiconductor substrate 10 is prepared. The semiconductor substrate 10 is formed, for example, using the existing Czochralski method (CZ method), casting, or the like. For example, a p-type polycrystalline silicon ingot manufactured with casting is sliced into a thickness of, for example, 250 μm or less to manufacture the semiconductor substrate 10. Here, for example, extremely slight etching on a surface of the semiconductor substrate 10 with an aqueous solution such as sodium hydroxide, potassium hydroxide, or hydrofluoric-nitric acid can remove a mechanically damaged layer and a contaminated layer in the cut surface of the semiconductor substrate 10.

Figure 8B:
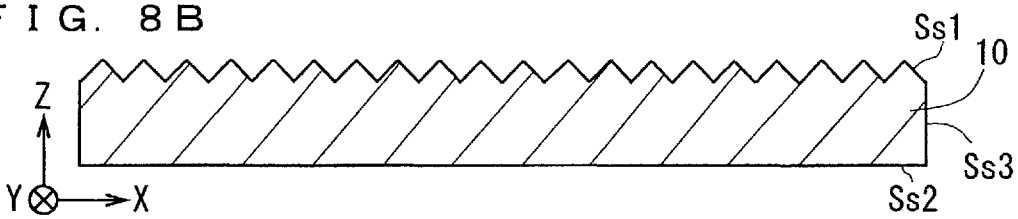

Next, as illustrated in FIG. 8B, a texture is formed on the first surface Ss1 of the semiconductor substrate 10. The texture can be formed with wet etching using an alkaline aqueous solution such as sodium hydroxide or an acid aqueous solution such as hydrofluoric-nitric acid, or with dry etching using a reactive ion etching (RIE) method or the like.

Figure 8C:
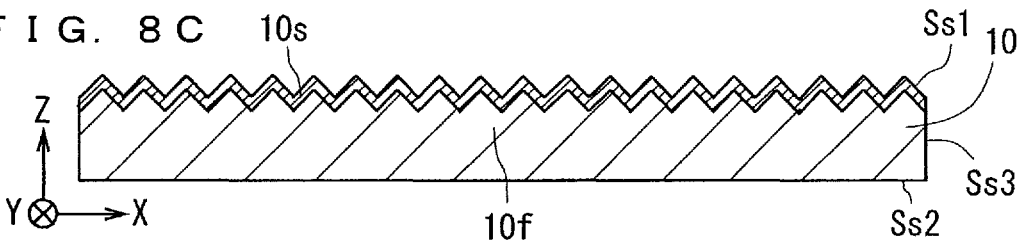

Next, as illustrated in FIG. 8C, the second semiconductor region 10s serving as an n-type semiconductor region is formed on the first surface Ss1 of the semiconductor substrate 10 having the texture. Specifically, the n-type second semiconductor region 10s is formed in a surface layer portion on the first surface Ss1 side of the semiconductor substrate 10 having the texture. The second semiconductor region 10s can be formed, for example, using an application and thermal diffusion method in which a diphosphorus pentoxide ($P_2O_5$) paste is applied to a surface of the semiconductor substrate 10 and then phosphorus is thermally diffused, a gas phase thermal diffusion method in which a phosphorus oxychloride ($POCl_3$) gas is used as a diffusion source, or the like. The second semiconductor region 10s is formed so as to have, for example, the depth of from about 0.1 μm to about 2 μm and a sheet resistance value of from about 40Ω/□ to about 200Ω/□.

Here, for example, if a second semiconductor region is formed also on the second surface Ss2 side at the time of forming the second semiconductor region 10s, the second semiconductor region formed on the second surface Ss2 side is removed with etching. For example, the second semiconductor region formed on the second surface Ss2 side can be removed by dipping a portion on the second surface Ss2 side of the semiconductor substrate 10 into a hydrofluoric-nitric-acid aqueous solution. With this, the first semiconductor region 10f having p-type conductivity can be exposed on the second surface Ss2 of the semiconductor substrate 10. After that, phosphorus glass adhering on the first surface Ss1 side of the semiconductor substrate 10 at the time of forming the second semiconductor region 10s is removed with etching. At this time, a second semiconductor region formed on the end surface Ss3 of the semiconductor substrate 10 may also be removed. Further, for example, a diffusion mask may be formed on the second surface Ss2 side of the semiconductor substrate 10 in advance to form the second semiconductor region 10s with the gas phase thermal diffusion method or the like, and then the diffusion mask may be removed. In this case, the second semiconductor region is not formed on the second surface Ss2 side, which will eliminate the necessity of a process of removing the second semiconductor region on the second surface Ss2 side.

Through the process above, the semiconductor substrate 10 including the first semiconductor region 10f in which the second semiconductor region 10s serving as an n-type semiconductor region is positioned on the first surface Ss1 side and a texture is formed on the first surface Ss1 can be prepared.

Figure 8D:
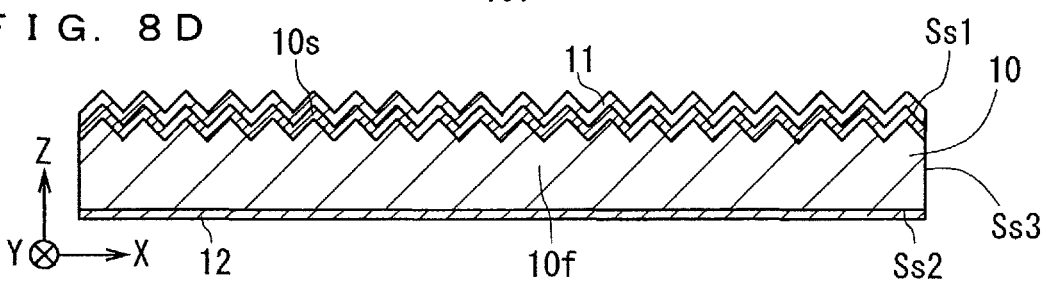

Next, as illustrated in FIG. 8D, for example, the passivation layer 12 mainly containing aluminium oxide or the like is formed at least on the second surface Ss2 of the semiconductor substrate 10. Further, for example, the antireflection film 11 containing silicon nitride or the like is formed at least on the first surface Ss1 of the semiconductor substrate 10. Here, the passivation layer 12 may be formed on the entire surface of the semiconductor substrate 10, and further, another antireflection film may be formed on the passivation layer 12. At this time, for example, the antireflection film 14A may be formed on the passivation layer 12 that is formed on the second surface Ss2 of the semiconductor substrate 10.

The passivation layer 12 can be formed, for example, with the ALD method or the like. According to the ALD method, for example, the passivation layer 12 can be formed on the entire circumferential surface of the semiconductor substrate 10, including the end surface Ss3 thereof. In a step of forming the passivation layer 12 according to the ALD method, firstly, the semiconductor substrate 10 in which the second semiconductor region 10s has been formed thereon is placed inside a chamber of a deposition device. Then, under a state in which the semiconductor substrate 10 is heated in a temperature region of from about 100° C. to about 250° C., the following Step A to Step D are repeated a plurality of times, thereby forming the passivation layer 12 mainly containing aluminium oxide.

[Step A] An aluminium material for forming aluminium oxide, such as trimethylaluminium (TMA), is supplied onto the semiconductor substrate 10 together with a carrier gas such as an Ar gas or a nitrogen gas. With this, the aluminium material is absorbed into the entire circumferential surface of the semiconductor substrate 10. A period of time for supplying TMA is, for example, from about 15 milliseconds to about 3,000 milliseconds. Before starting Step A, the semiconductor substrate 10 may be processed with diluted hydrofluoric acid and then cleaned with pure water, so as to terminate the surface of the semiconductor substrate 10 with an OH group.

[Step B] The inside of the chamber of the deposition device is purified with a nitrogen gas, thereby removing the aluminium material inside the chamber. Further, an aluminium material except a component chemically absorbed on an atomic layer level is removed from the aluminium material that is physically and chemically absorbed into the semiconductor substrate 10. A period of time for purifying the inside of the chamber with a nitrogen gas is, for example, from about 1 second to about several tens of seconds.

[Step C] An oxidizing agent, such as water or an ozone gas, is supplied into the chamber of the deposition device, thereby removing an alkyl group contained in TMA and substituting the alkyl group with an OH group. With this, an aluminium oxide atomic layer is formed on the semiconductor substrate 10. A period of time for supplying the oxidizing agent into the chamber is, for example, from about 750 milliseconds to about 1,100 milliseconds. Here, for example, hydrogen may be supplied into the chamber together with the oxidizing agent. With this, hydrogen atoms are easily contained in the aluminium oxide.

[Step D] The inside of the chamber of the deposition device is purified with a nitrogen gas, thereby removing the oxidizing agent inside the chamber. At this time, for example, an oxidizing agent that fails to contribute to the reaction at the time of forming the aluminium oxide on an atomic layer level on the semiconductor substrate 10 is removed. Here, a period of time for purifying the inside of the chamber with a nitrogen gas is, for example, from about 1 second to about several tens of seconds.

After this, a series of steps of sequentially carrying out Step A to Step D is repeated a plurality of times, whereby an aluminium oxide layer having a desired thickness can be formed.

The antireflection film 11 is formed, for example, using the PECVD method or the sputtering method. When the PECVD method is used, the semiconductor substrate 10 is heated in advance at a temperature higher than a temperature at the time of deposition of the antireflection film 11. After that, a mixed gas of silane ($SiH_4$) and ammonia ($NH_3$) is diluted with a nitrogen ($N_2$) gas. Then, plasmas of the diluted mixed gas generated by glow discharge decomposition at a reaction pressure of from about 50 Pa to about 200 Pa are deposited on the heated semiconductor substrate 10. With this, the antireflection film 11 is formed on the semiconductor substrate 10. At this time, the temperature for the deposition is from about 350° C. to about 650° C., and the temperature for heating the semiconductor substrate 10 in advance is set higher than the temperature for the deposition by about 50° C. The frequency of a high-frequency power source necessary for the glow discharge is from about 10 kHz to about 500 kHz. The flow rate of the gas is appropriately determined in accordance with the size of the reaction chamber etc. For example, the flow rate of the gas ranges from about 150 ml/min (sccm) to about 6,000 ml/min (sccm). At this time, a value (B/A) obtained by dividing a flow rate B of an ammonia gas by a flow rate A of a silane gas ranges from 0.5 to 1.5.

Figure 8E:
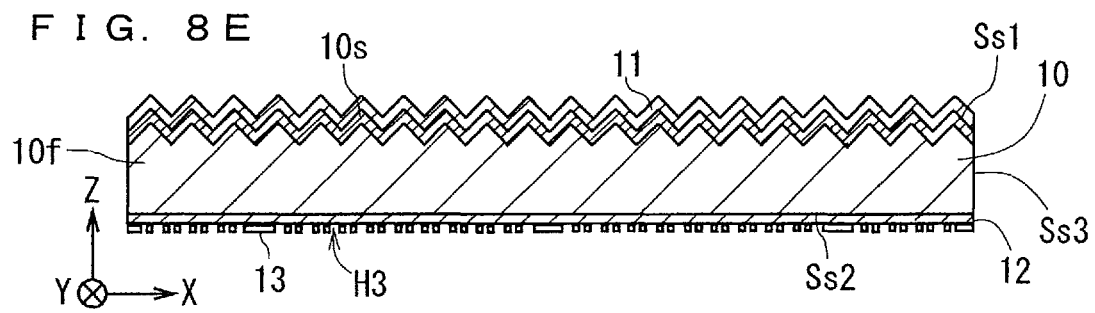

Next, as illustrated in FIG. 8E, for example, on the second surface Ss2 side of the semiconductor substrate 10, the protective layer 13 having the holes H3 is formed at least partially on the passivation layer 12. The protective layer 13 is, for example, formed on the passivation layer 12 that is formed on the second surface Ss2 of the semiconductor substrate 10 with a dry process using PECVD, sputtering, or the like, or with a wet process using application of a solution or the like. In a dry process, for example, a mask is appropriately used, whereby the protective layer 13 having the holes H3 can be formed on the passivation layer 12 at least on the second surface Ss2 side of the semiconductor substrate 10. In a wet process, for example, at least on the second surface Ss2 side of the semiconductor substrate 10, a solution such as an insulation paste is applied on the passivation layer 12 so as to have a pattern including the holes H3 and the solution is then dried, whereby the protective layer 13 can be formed. The application of the solution can be implemented with, for example, screen printing or the like. Here, for example, the applied insulation paste is dried using a hot plate, a drying oven, or the like under the condition that the highest temperature is from about 150° C. to about 350° C. and a period of time for heating is from about 1 minute to about 10 minutes. With this, the protective layer 13 having a desired pattern is formed on the passivation layer 12.

Figure 8F:
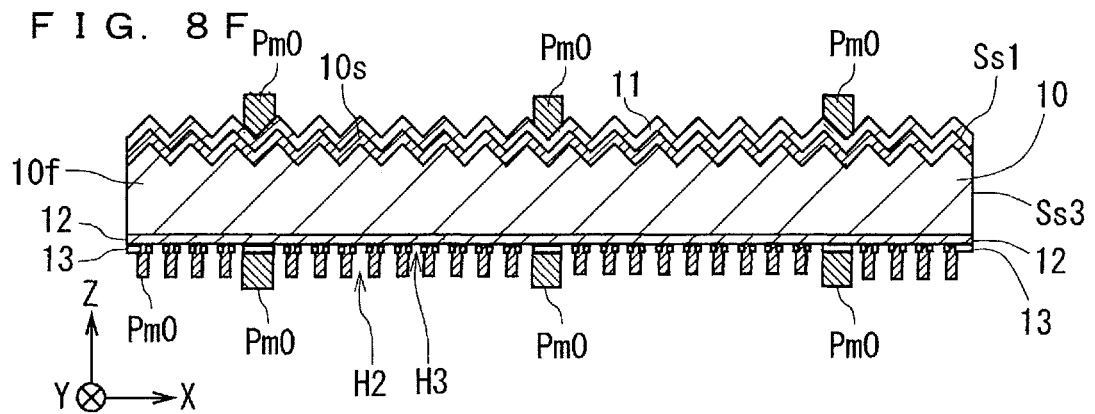
Figure 10A:
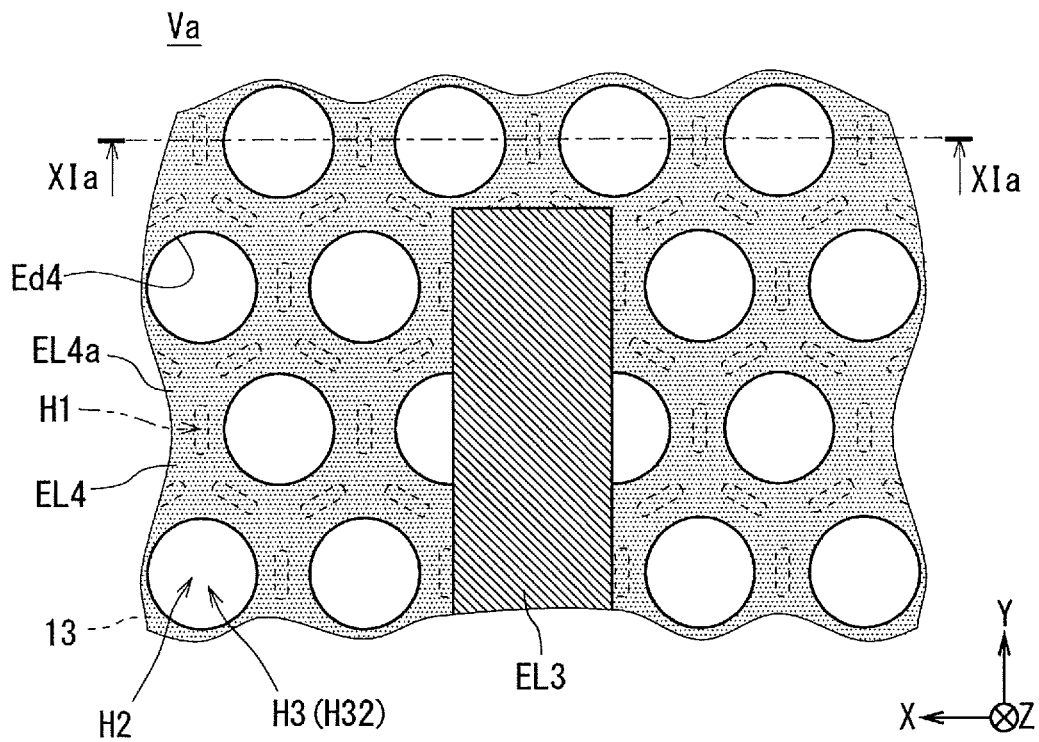
FIG. 10A illustrates an enlarged plan view showing enlarged external appearance of an example of a portion corresponding to the portion Va of FIG. 3B in the solar cell element according to a second embodiment as seen from the second element surface side.
Figure 10B:
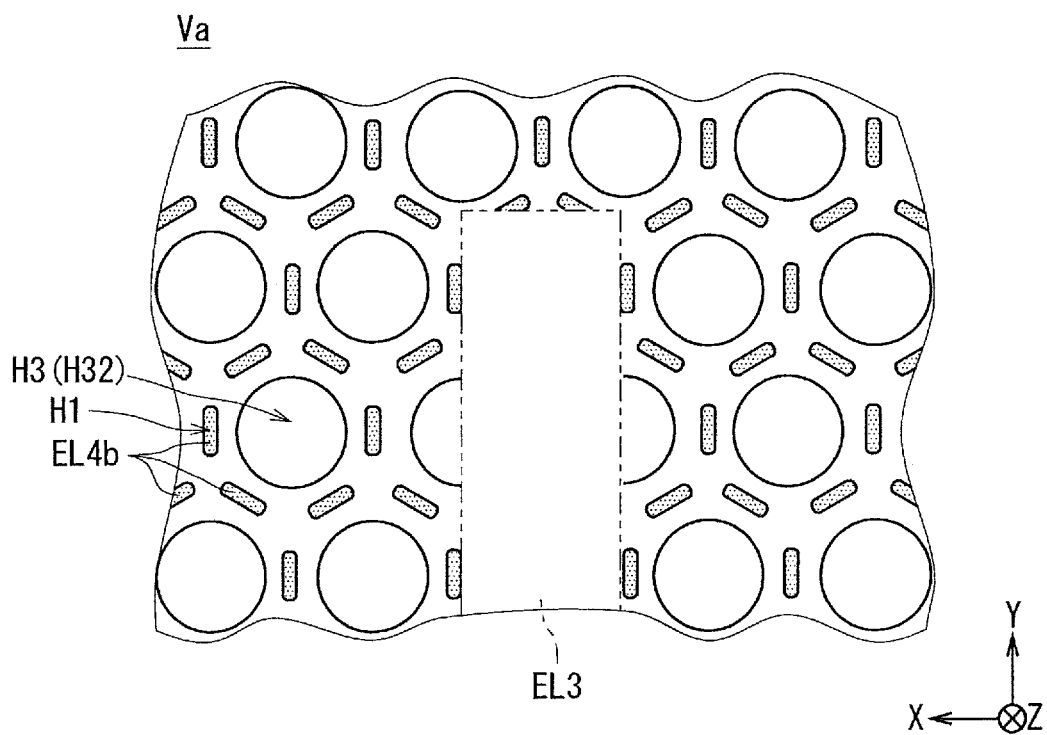
FIG. 10B illustrates an enlarged plan view showing an enlarged configuration of the protective layer of the example of the portion corresponding to the portion Va of FIG. 3B in the solar cell element according to the second embodiment.
Figure 11A:
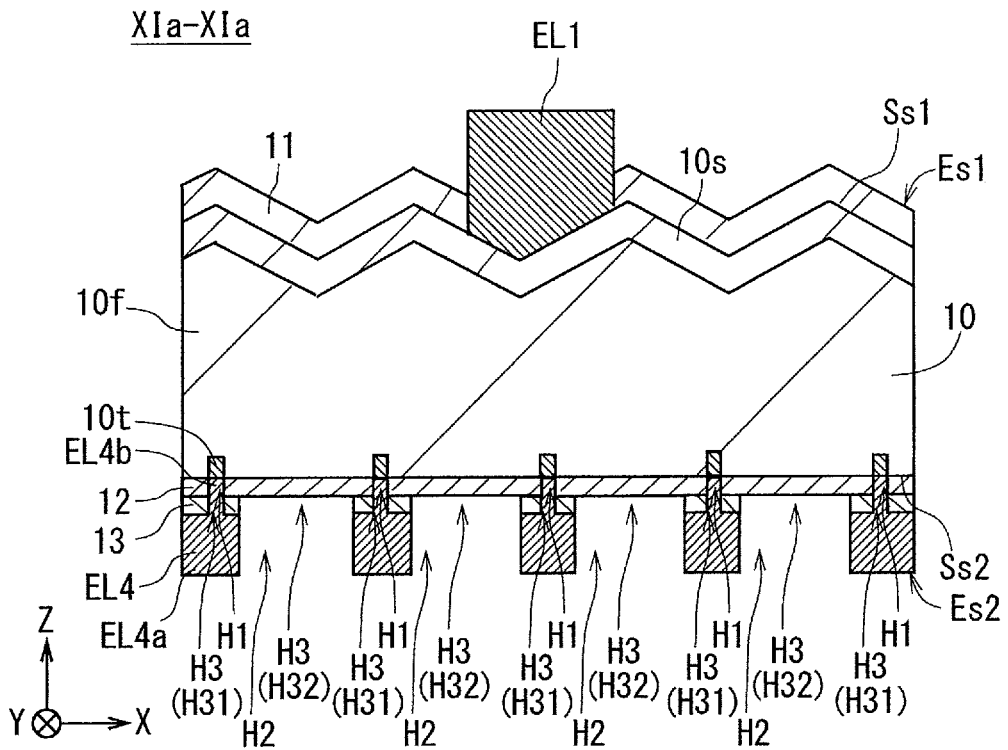
FIG. 11A illustrates a view showing an example of an end surface of a portion taken across the solar cell element along the line XIa-XIa of FIG. 10A.
Figure 11B:
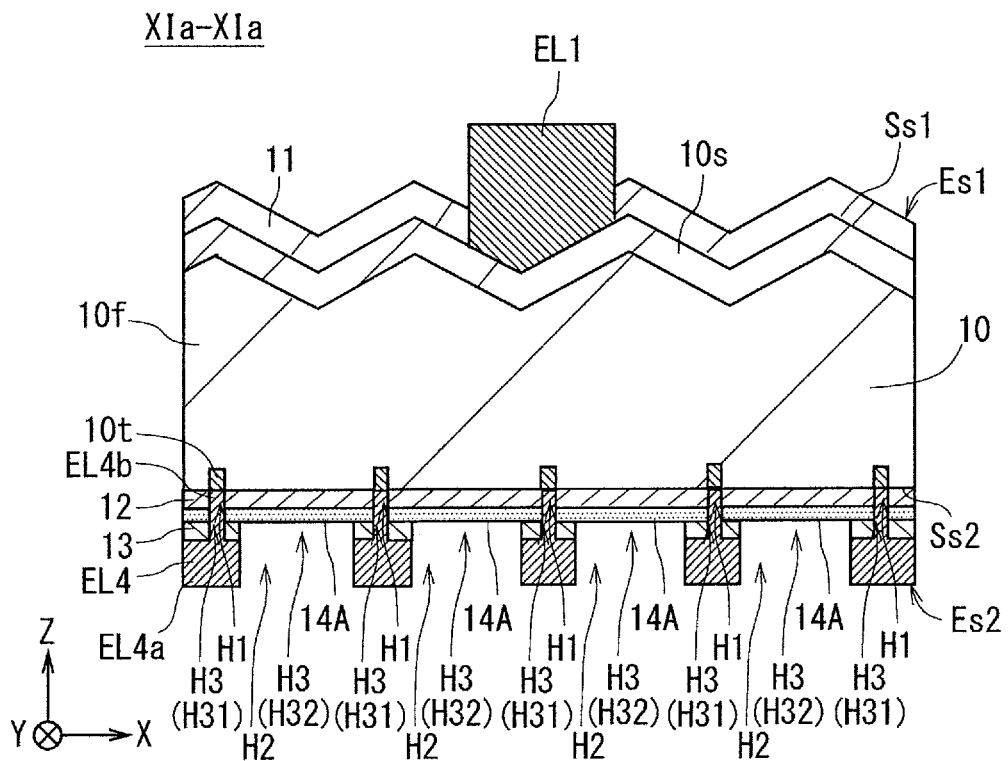
FIG. 11B illustrates a view showing another example of the end surface of the portion taken across the solar cell element along the line XIa-XIa of FIG. 10A.

Next, as illustrated in FIG. 8F, a material for forming an electrode is disposed on the antireflection film 11 on the first surface Ss1 side of the semiconductor substrate 10, on the protective layer 13 on the second surface Ss2 side of the semiconductor substrate 10, and inside the first holes H1 and the third holes H31. In the first embodiment, as the material for forming an electrode, a metallic paste Pm0, such as a silver paste and an aluminium paste, is adopted. After that, for example, the material for forming an electrode is fired with heating, thereby forming the first output extracting electrode EL1, the first collecting electrode EL2, the second output extracting electrode EL3, and the second collecting electrode EL4 as illustrated in FIG. 4. Here, for example, the disposition and the firing with heating of the material for forming an electrode may be individually carried out for the first output extracting electrode EL1, the first collecting electrode EL2, the second output extracting electrode EL3, and the second collecting electrode EL4. Further, for example, the material for forming an electrode may be disposed for at least two electrodes among the first output extracting electrode EL1, the first collecting electrode EL2, the second output extracting electrode EL3, and the second collecting electrode EL4, and then the firing with heating may be carried out collectively.

The first output extracting electrode EL1 and the first collecting electrode EL2 are manufactured, for example, using a silver paste. Firstly, a silver paste is applied on the first surface Ss1 side of the semiconductor substrate 10. In the first embodiment, the silver paste is applied on the antireflection film 11 that is formed on the first surface Ss1 side of the semiconductor substrate 10. The application of the silver paste is implemented with, for example, screen printing or the like. After the application of the silver paste, a solvent in the silver paste may be vaporized at a predetermined temperature to dry the silver paste. After that, for example, the silver paste is fired under the condition that the highest temperature in a firing oven is from about 600° C. to about 850° C. and a period of time for heating is from about several tens of seconds to about several tens of minutes, thereby forming the first output extracting electrode EL1 and the first collecting electrode EL2. At this time, for example, the silver paste fires through the antireflection film 11, thereby bringing the first output extracting electrode EL1 and the first collecting electrode EL2 into connection with the first surface Ss1 of the semiconductor substrate 10.

The second output extracting electrode EL3 is manufactured, for example, using a silver paste. As a method of applying a silver paste on the semiconductor substrate 10, for example, screen printing or the like can be used. After the application of the silver paste, a solvent in the silver paste may be vaporized at a predetermined temperature to dry the silver paste. After that, the silver paste is fired under the condition that the highest temperature in a firing oven is from about 600° C. to about 850° C. and a period of time for heating is from about several tens of seconds to about several tens of minutes, thereby forming the second output extracting electrode EL3 on the second surface Ss2 side of the semiconductor substrate 10.

The second collecting electrode EL4 is manufactured, for example, using an aluminium paste. Firstly, an aluminium paste is applied on the second surface Ss2 side of the semiconductor substrate 10 so as to come in contact with a part of the silver paste applied in advance. In the first embodiment, an aluminium paste is applied on the protective layer 13 formed on the second surface Ss2 side and inside the third holes H31. Here, the application of the aluminium paste can be implemented with, for example, screen printing or the like. Here, after the application of the aluminium paste, a solvent in the aluminium paste may be vaporized at a predetermined temperature to dry the aluminium paste. After that, for example, the aluminium paste is fired under the condition that the highest temperature in a firing oven is from about 600° C. to about 850° C. and a period of time for heating is from about several tens of seconds to about several tens of minutes, thereby forming the second collecting electrode EL4 on the second surface Ss2 side of the semiconductor substrate 10. At this time, the aluminium paste inside the third hole H31 fires through the passivation layer 12, thereby bringing the second collecting electrode EL4 into connection with the second surface Ss2 of the semiconductor substrate 10. At this time, the third semiconductor region 10t is also formed along with the formation of the second collecting electrode EL4. Meanwhile, the aluminium paste on the protective layer 13 does not easily fire through the passivation layer 12 owing to blocking of the protective layer 13. Therefore, at the time of firing the aluminium paste, the passivation layer 12 blocked by the protective layer 13 is not easily adversely affected by the firing.

Here, for example, the second output extracting electrode EL3 may be formed after forming the second collecting electrode EL4. The second output extracting electrode EL3 may be, for example, in direct contact with the semiconductor substrate 10, or may be out of direct contact with the semiconductor substrate 10 due to the presence of the passivation layer 12 or the like positioned between the second output extracting electrode EL3 and the semiconductor substrate 10. Further, the second output extracting electrode EL3 may be provided so as to be positioned on the protective layer 13.

1-5. Method of Manufacturing Solar Cell Module

An example of a method of manufacturing the solar cell module 100 is described with reference to FIG. 9.

For example, as illustrated in FIG. 9, the first member 101, the first filler 102u, the solar cell portion 103 including a plurality of the solar cell strings SG1, the second filler 102b, and the second member 104 are stacked in the mentioned order. Then, for example, the first member 101, the first filler 102u, the solar cell portion 103, the second filler 102b, and the second member 104 are integrated by a laminator, whereby the solar cell module 100 as illustrated in FIG. 2 can be manufactured. On the second module surface ms2 of the solar cell module 100, for example, a terminal box bx1 for extracting electricity obtained by photoelectric conversion in the solar cell portion 103 is attached. Further, for example, a frame member may be attached on the outer peripheral portion of the solar cell module 100. With this, the solar cell module 100 can be reinforced.

Here, for example, in the solar cell module 100 according to the first embodiment, the above-mentioned second filler 102b and second member 104 are not limited to ones having light transmissivity. For example, as the second filler 102b, EVA colored to be white or the like obtained by adding titanium oxide or the like may be used. With this, light transmitted through the solar cell element 1 and light passing through between the solar cell elements 1 are reflected to enter the solar cell element 1 again from the second element surface Es2 side, whereby the output of the solar cell module 100 can be enhanced. Similarly, for example, as the second member 104, a weatherproof fluorine-based resin sheet sandwiching an aluminium foil having a white surface, a PET sheet in which alumina or silica is deposited, or the like may be used. With this, light transmitted through the solar cell element 1, light passing through between the solar cell elements 1, and light transmitted through the second member 104 are reflected to enter the solar cell element 1 again from the second element surface Es2 side, whereby the output of the solar cell module 100 can be enhanced.

1-6. Gist of First Embodiment

In the solar cell element 1 according to the first embodiment, for example, the second collecting electrode EL4 positioned on the second surface Ss2 side of the semiconductor substrate 10 includes the plurality of connection portions EL4b in connection with the second surface Ss2 via the plurality of first holes H1 of the passivation layer 12. Further, the second collecting electrode EL4 has, for example, the plurality of second holes H2 penetrating through the second collecting electrode EL4. Owing to the presence of the plurality of second holes H2, for example, sunlight can pass through the plurality of second holes H2 and can enter the second surface Ss2 of the semiconductor substrate 10. With this, for example, in the semiconductor substrate 10, not only photoelectric conversion in response to light received on the first surface Ss1, but also photoelectric conversion in response to light passing through the second holes H2 and received on the second surface Ss2 can carried out. As a result, for example, photoelectric conversion efficiency of the PERC solar cell element 1 can be enhanced.

Further, for example, in plan view of the second element surface Es2, the curved peripheral edge portion Ed4 of each second hole H2 hardly generates a portion where angles are discontinuously changed in the inner peripheral surface of the second hole H2. With this, for example, even if the solar cell element 1 is bent in response to applied stress or the like, the stress is hardly concentrated in the second hole H2 of the second collecting electrode EL4. Therefore, for example, the solar cell element 1 is hardly cracked. As a result, for example, reliability of the PERC solar cell element 1 can be enhanced. Therefore, for example, well-balanced enhancement in photoelectric conversion efficiency and enhancement in reliability of the PERC solar cell element 1 can be realized. Further, for example, the solar cell module 100 having high photoelectric conversion efficiency that is not easily reduced irrespective of bend caused by application of stress can be realized.

2. Other Embodiments

The present disclosure is not limited to the first embodiment described above, and various changes and improvements can be made thereto within the scope not departing from the gist of the present disclosure.

2-1. Second Embodiment

In the above first embodiment, for example, as illustrated in FIG. 10A to FIG. 11B, in plan view of the second element surface Es2, the protective layer 13 may be absent inside each of the second holes H2. In other words, for example, in a perspective plan view seen through the second element surface Es2, the protective layer 13 need not be positioned in a region inside of each second hole H2, and may be positioned in a region outside of each second hole H2. With this, for example, light that passes through the second holes H2 of the second collecting electrode EL4 to be radiated to the second surface Ss2 is hardly blocked by the protective layer 13. As a result, for example, photoelectric conversion efficiency of the PERC solar cell element 1 can be enhanced.

2-2. Third Embodiment

Figure 12A:
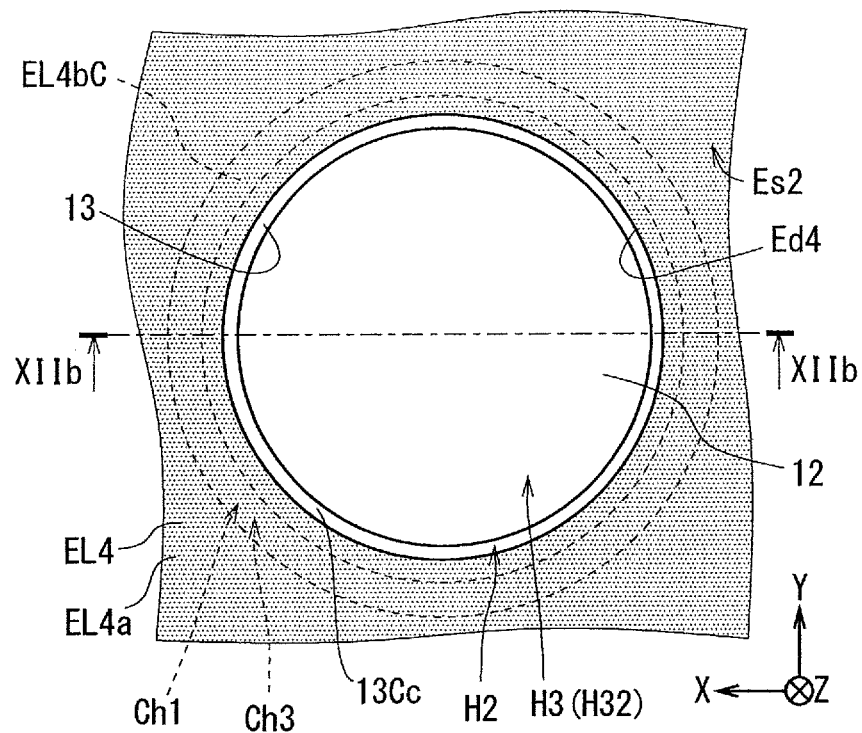
FIG. 12A illustrates a plan view showing external appearance of an example of a portion including the second hole and its vicinity in the solar cell element according to a third embodiment as seen from the second element surface side.
Figure 12B:
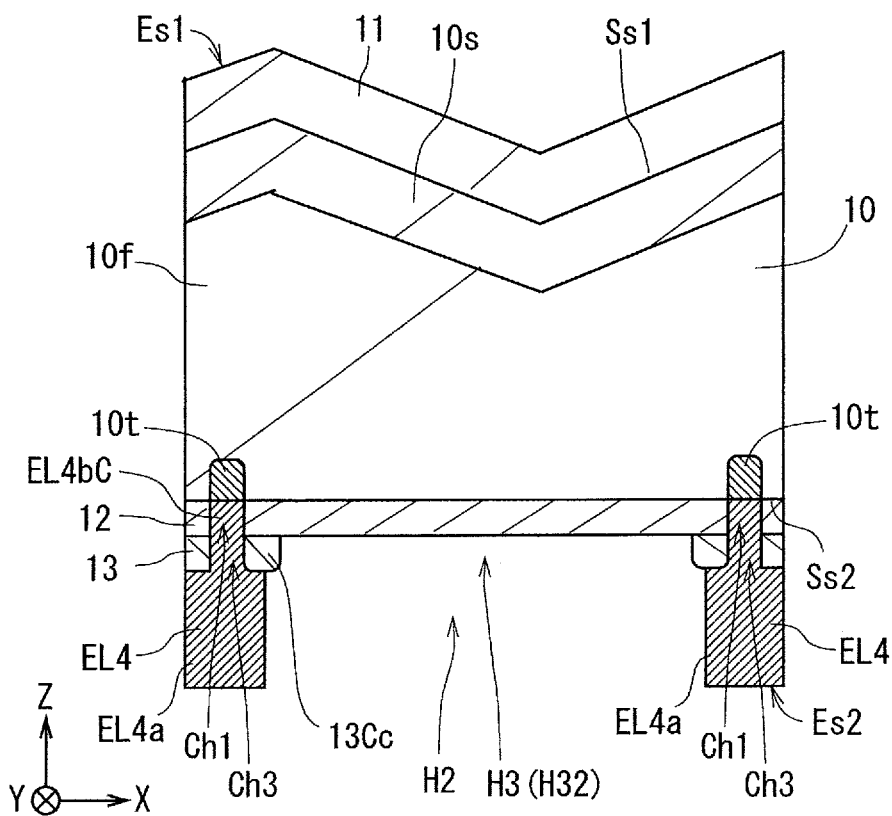
FIG. 12B illustrates a view showing an example of an end surface of a portion taken across the solar cell element along the line XIIb-XIIb of FIG. 12A.

In the above first embodiment, for example, as illustrated in FIG. 12A and FIG. 12B, in a perspective plan view seen through the second element surface Es2, the protective layer 13 may have an annular hole (also referred to as a first annular hole) Ch3 that penetrates through the protective layer 13 in the thickness direction thereof. The first annular hole Ch3 surrounds the fourth hole H32 in a perspective plan view seen through the second element surface Es2. In other words, for example, the protective layer 13 may have an annular portion 13Cc that forms a peripheral edge portion of the fourth hole H32. Here, for example, the passivation layer 12 may have an annular hole (also referred to as a second annular hole) Ch1 that penetrates through the passivation layer 12 in the thickness direction thereof and is in communication with the first annular hole Ch3. Here, further, for example, in a perspective plan view seen through the second element surface Es2, the plurality of connection portions EL4b may include, in a state of surrounding the second hole H2, an annular connection portion EL4bC positioned in a region inside the second annular hole Ch1 and the first annular hole Ch3. Here, for example, the third semiconductor region 10t may be positioned in a portion in connection with the annular connection portion EL4bC in the surface layer portion on the second surface Ss2 of the semiconductor substrate 10.

For example, adoption of the configuration above hardly allows a metallic paste to flow into the fourth hole H32 at the time when the second collecting electrode EL4 is formed by applying the metallic paste, owing to the presence of the annular portion 13Cc positioned between the first annular hole Ch3 and the fourth hole H32 in the protective layer 13. With this, for example, the area of the second hole H2 in plan view of the second element surface Es2 is hardly reduced. Therefore, for example, light to be radiated to the second surface Ss2 through the second hole H2 and the fourth hole H32 is hardly blocked. As a result, for example, photoelectric conversion efficiency of the PERC solar cell element 1 can be enhanced.

2-3. Fourth Embodiment

Figure 13A:
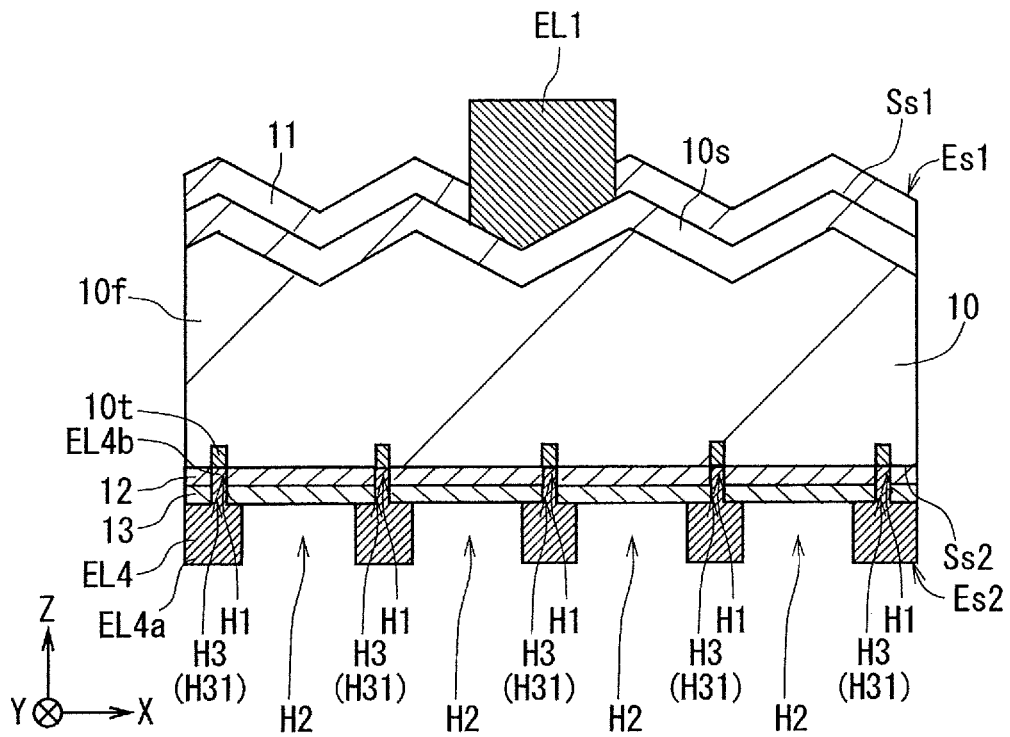
FIG. 13A illustrates a view showing an end surface of an example of a portion corresponding to a portion of FIG. 6A taken across the solar cell element according to a fourth embodiment.
Figure 13B:
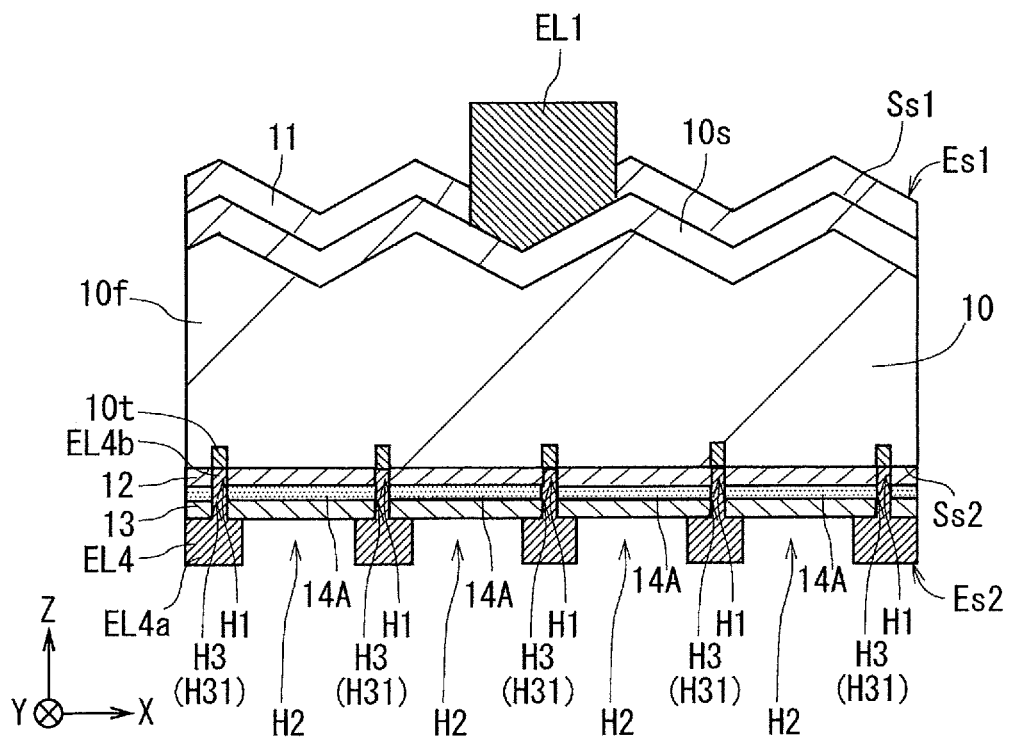
FIG. 13B illustrates a view showing an end surface of another example of the portion corresponding to the portion of FIG. 6A taken across the solar cell element according to the fourth embodiment.

In each of embodiments in the above, for example, as illustrated in FIG. 13A and FIG. 13B, in a perspective plan view seen through the second element surface Es2, the protective layer 13 may be positioned so as to fill the entire region inside each second hole H2. In other words, for example, the protective layer 13 need not have the fourth holes H32. For example, adoption of such a configuration hardly allows water and acid to enter the passivation layer 12 from the outside of the solar cell element 1. Here, owing to the above configuration, for example, the passivation layer 12 is hardly changed in quality. As a result, for example, reliability of the PERC solar cell element 1 can be enhanced. Here, for example, in the solar cell module 100, even when EVA is used as a material of the filler 102 positioned so as to cover the plurality of solar cell elements 1 and acetic acid is generated due to hydrolysis of EVA or the like, the acetic acid hardly enter the passivation layer 12 from the outside of the solar cell element 1.

2-4. Fifth Embodiment

Figure 14A:
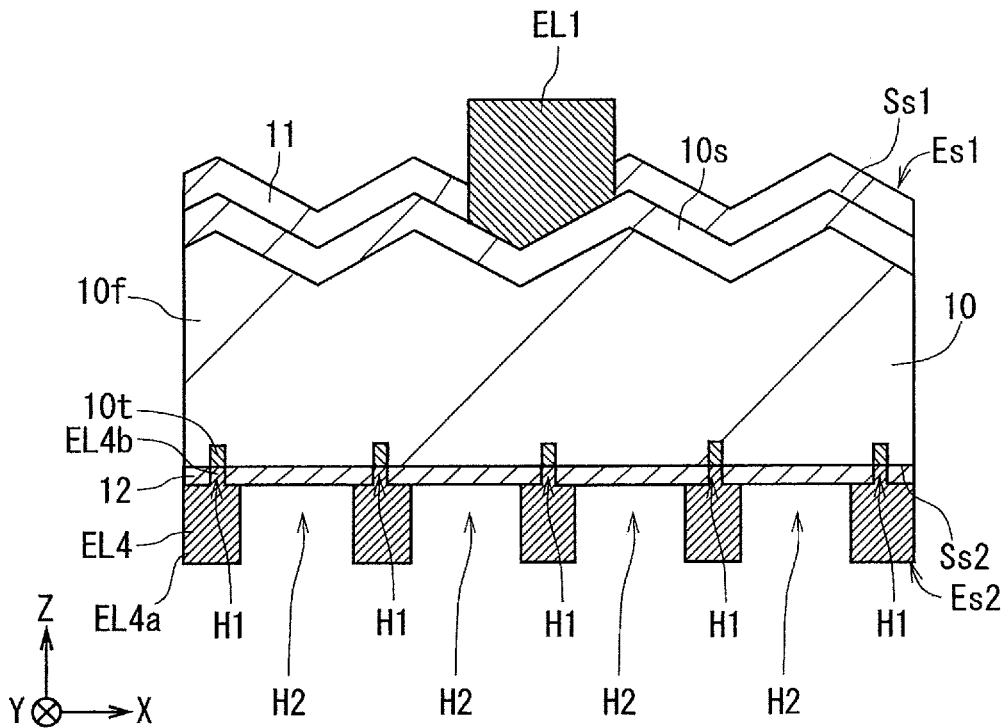
FIG. 14A illustrates a view showing an end surface of an example of a portion corresponding to the portion of FIG. 6A taken across the solar cell element according to a fifth embodiment.
Figure 14B:
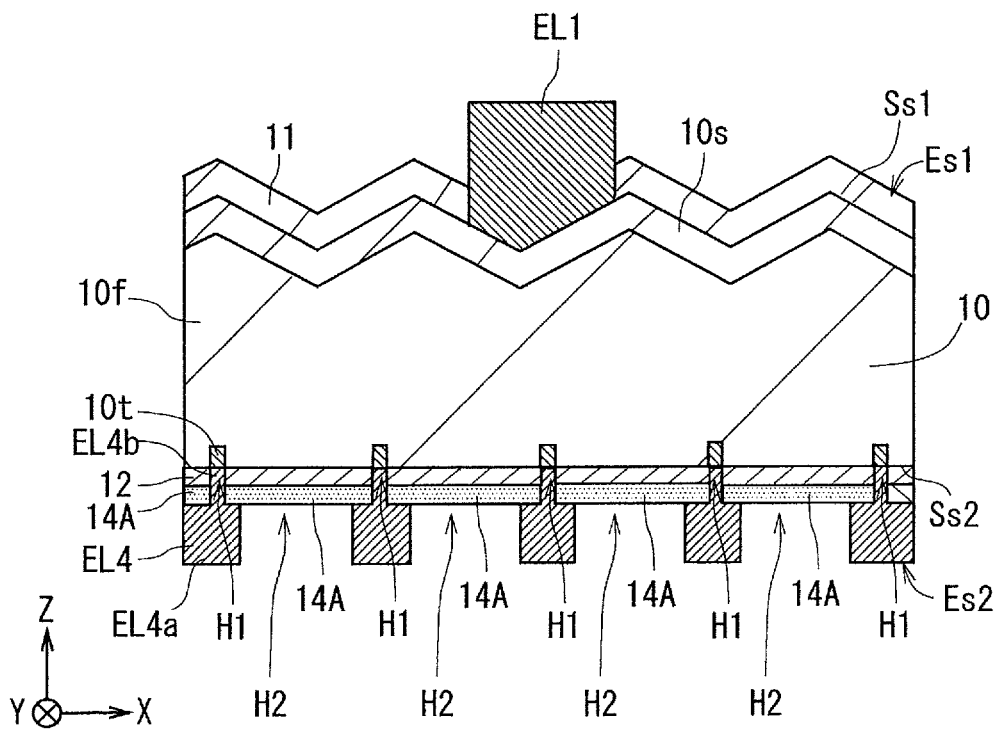
FIG. 14B illustrates a view showing an end surface of another example of the portion corresponding to the portion of FIG. 6A taken across the solar cell element according to the fifth embodiment.

In each of embodiments in the above, for example, as illustrated in FIG. 14A and FIG. 14B, the protective layer 13 may be absent. In this case, on the second surface Ss2 side of the semiconductor substrate 10, the second collecting electrode EL4 may be positioned on the passivation layer 12 such that antireflection film 14A is sandwiched by the second collecting electrode EL4 and the passivation layer 12 as illustrated in FIG. 14B, or the second collecting electrode EL4 may be positioned directly on the passivation layer 12 as illustrated in FIG. 14A.

Such a configuration can be formed, for example, through the process as below. For example, firstly, the passivation layer 12 is formed on the entire surface of the second surface Ss2. Next, an aluminium paste is applied on the passivation layer 12 in a pattern corresponding to the shape of the connection portions EL4b, and the aluminium paste is then dried and fired. At this time, for example, the aluminium paste fires through the passivation layer 12, thereby forming the first holes H1 and the connection portions EL4b. Next, for example, a thermosetting metallic paste is applied on the passivation layer 12 in a pattern corresponding to the first portion EL4a having the second holes H2, and then the metallic paste is cured with heating, thereby forming the first portion EL4a. With this, the second collecting electrode EL4 having the first portion EL4a and the connection portions (second portions) EL4b can be formed. Here, as the thermosetting metallic paste, for example, a metallic paste that contains metal powder including copper as a main component, or a metallic paste that contains metal powder including silver as a main component, is curable at a temperature of 150° C. or less (in particular, 100° C. or less), and does not significantly affect the passivation layer 12 is applicable. For example, a conductive resin paste obtained by dispersing in a thermosetting resin such as an epoxy resin, a metallic filler containing at least one species of silver and copper can be used. Here, for example, in place of the thermosetting metallic paste, an aluminium paste containing a glass component that hardly fires through the passivation layer 12 may be adopted. In this case, the first portion EL4a can be formed by applying, drying, and firing of the aluminium paste.

3. Others

Figure 15A:
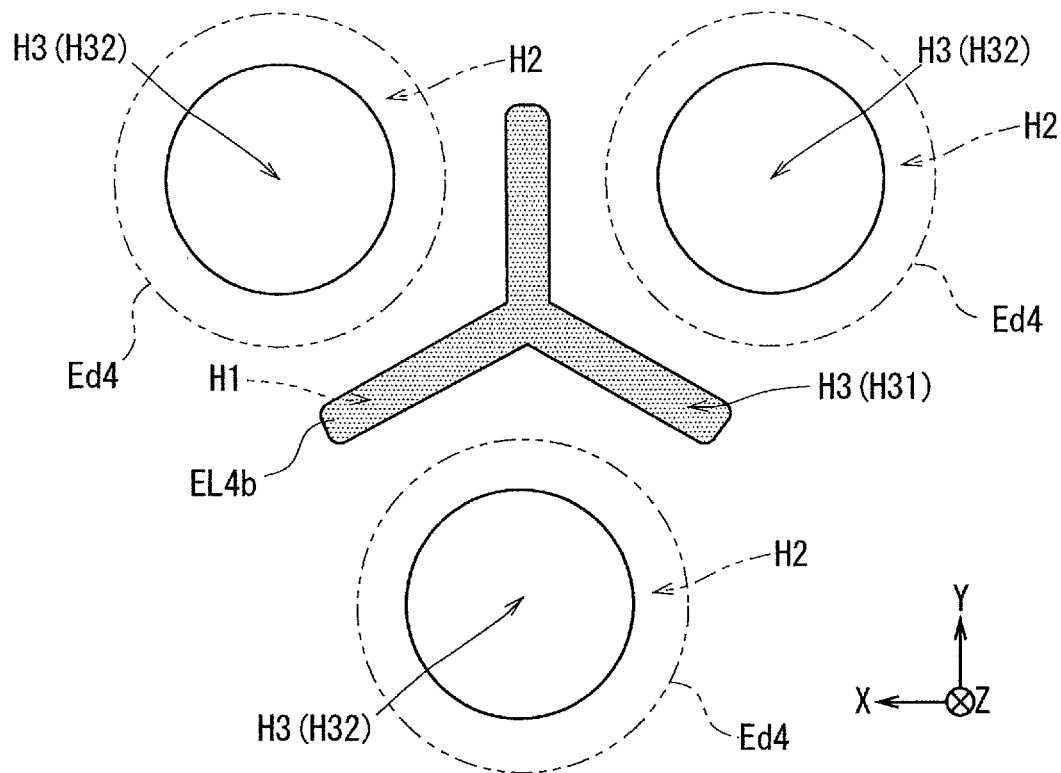
FIG. 15A illustrates a view showing an example of a shape of a connection portion.
Figure 15B:
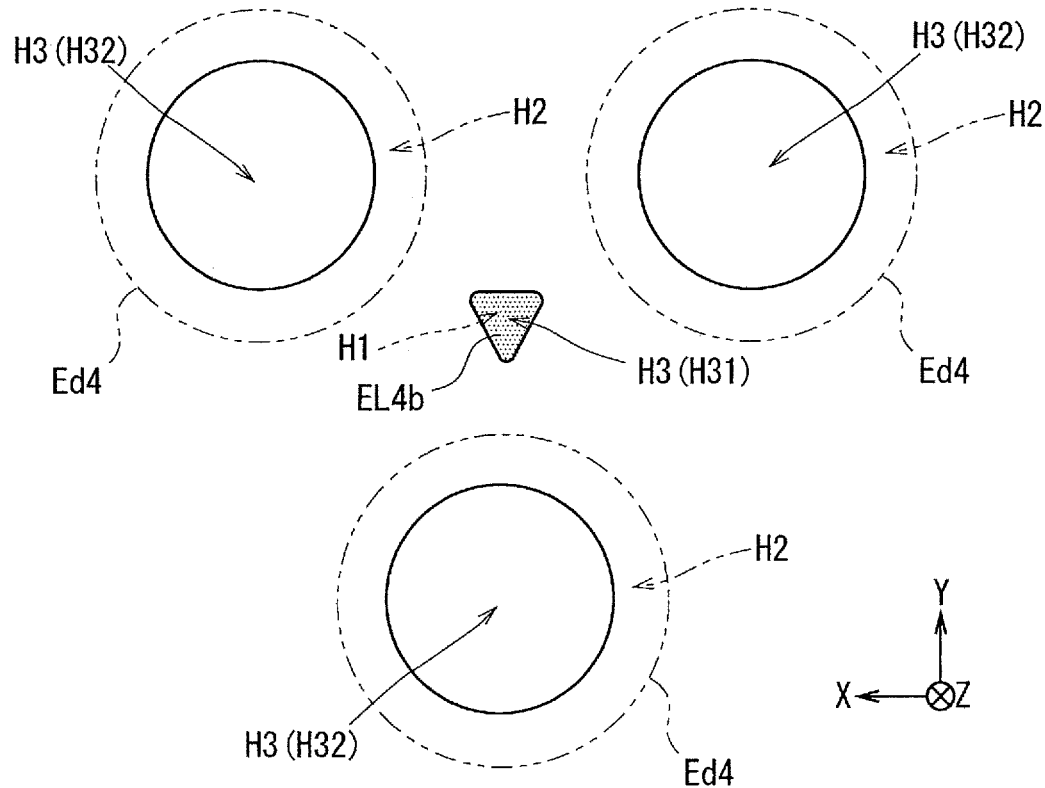
FIG. 15B illustrates a view showing another example of a shape of the connection portion.

In each of embodiments in the above, for example, as illustrated in FIG. 15A, in a perspective plan view seen through the second element surface Es2, the connection portion EL4b may have a Y-like shape in which three elongated portions are joined at a position among three adjacent second holes H2. Further, for example, as illustrated in FIG. 15B, in a perspective plan view seen through the second element surface Es2, the connection portion EL4b may have various shapes at a position among three adjacent second holes H2.

In each of embodiments in the above, for example, in plan view of the second element surface Es2, when the peripheral edge portion Ed4 of each second hole H2 has an oval shape, a case where the three imaginary lines virtually connecting the centers C2 of adjacent three second holes H2 form an isosceles triangle is conceivable.

In each of embodiments in the above, for example, the shape of the peripheral edge portion Ed4 of the second hole H2 of the second collecting electrode EL4 in plan view of the second element surface Es2 may be a shape formed of a curved lined difference from a circular shape or an oval shape, such as a triangular shape with rounded corners.

Needless to say, a part or the whole of each of embodiments in the above and each of various modifications can be appropriately combined as far as contradiction does not arise.

The invention claimed is:

1. A solar cell element comprising:
    a semiconductor substrate having a first surface and a second surface that faces in an opposite direction to the first surface;
    a passivation layer positioned on the second surface, the passivation layer comprises a plurality of first holes each penetrating through the passivation layer;
    a collecting electrode comprising a plurality of connection portions in connection with the second surface in the plurality of first holes, and a plurality of second holes each penetrating through the collecting electrode and each having a curved peripheral edge portion in plan view; and
    a protective layer on or below the passivation layer, wherein the protective layer comprises a plurality of third holes penetrating through the protective layer and being respectively in communication with the plurality of first holes, and a plurality of fourth holes penetrating through the protective layer and being respectively in communication with the plurality of second holes, and
    wherein the collecting electrode is positioned on the protective layer.

2. The solar cell element according to claim 1, wherein in a perspective plan view of the collecting electrode, the plurality of connection portions comprise at least two connection portions arrayed so as to surround one of the plurality of second holes.

3. The solar cell element according to claim 1, further comprising
    an antireflection film positioned on an opposite side to the semiconductor substrate of the passivation layer and made of a material different from a material of the passivation layer, wherein
    in plan view, the antireflection film is positioned in a region inside each of the plurality of the second holes.

4. The solar cell element according to claim 3, wherein the semiconductor substrate comprises a p-type first semiconductor region positioned on a side of the second surface, and an n-type second semiconductor region positioned on a side of the first surface,
    a material of the passivation layer comprises aluminium oxide, and
    a material of the antireflection film comprises a material of at least one of silicon nitride and silicon oxide.

5. The solar cell element according to claim 1, wherein:
    in a perspective plan view seen through the second surface, the protective layer is not positioned in a region inside each of the plurality of second holes, and is positioned in a region outside each of the plurality of second holes.

6. The solar cell element according to claim 1, wherein:
in a perspective plan view of the collecting electrode and the protective layer, each of the plurality of fourth holes is positioned in a region inside a corresponding one of the plurality of second holes.

7. The solar cell element according to claim 6, wherein
in a perspective plan view seen through the second surface, the protective layer comprises an annular hole penetrating through the protective layer and surrounding one of the plurality of fourth holes, and
in a perspective plan view of the collecting electrode, the plurality of connection portions comprise an annular connection portion positioned in a region inside the annular hole and being surrounding one of the plurality of second holes.

8. The solar cell element according to claim 1, further comprising
a protective layer on the passivation layer, wherein
in a perspective plan view seen through the second surface, the protective layer is positioned so as to fill an entire region inside each of the plurality of second holes.

9. The solar cell element according to claim 1, wherein
in plan view, the passivation layer comprises an optically exposed portion inside each of the plurality of second holes.

10. The solar cell element according to claim 1, wherein
the plurality of second holes comprise a second-A hole, a second-B hole, and a second-C hole that are positioned adjacently to each other, and
in plan view of the collecting electrode, in an orthogonal direction being orthogonal to an imaginary line connecting a first center of the second-A hole and a second center of the second-B hole, the second-C hole is positioned away from a region between the second-A hole and the second-B hole.

11. A solar cell module comprising:
a plurality of solar cell elements of claim 1 that are two-dimensionally arrayed;
a plurality of wires mutually electrically connecting adjacent solar cell elements among the plurality of solar cell elements;
a first member having light transmissivity that is positioned on a side of the first surface of the plurality of solar cell elements;
a second member positioned on a side of the second surface of the plurality of solar cell elements;
a first filler having light transmissivity that is positioned between the plurality of solar cell elements and the first member; and
a second filler positioned between the plurality of solar cell elements and the second member.

12. The solar cell module according to claim 11, wherein the second member and the second filler have light transmissivity.

* * * * *